(12) United States Patent
Nishiwaki

(10) Patent No.: US 8,359,931 B2
(45) Date of Patent: Jan. 29, 2013

(54) SHEAR FORCE DETECTION DEVICE, TACTILE SENSOR AND GRASPING APPARATUS

(75) Inventor: Tsutomu Nishiwaki, Azumino (JP)

(73) Assignee: Seiko Epson Corporation (JP)

( * ) Notice: Subject to any disclaimer, the term of this patent is extended or adjusted under 35 U.S.C. 154(b) by 125 days.

(21) Appl. No.: 12/950,271

(22) Filed: Nov. 19, 2010

(65) Prior Publication Data

US 2011/0121591 A1 May 26, 2011

(30) Foreign Application Priority Data

Nov. 25, 2009 (JP) ................................. 2009-267935

(51) Int. Cl.
*G01N 3/24* (2006.01)
*G01L 1/00* (2006.01)
*B25J 19/00* (2006.01)

(52) U.S. Cl. ................. 73/846; 73/841; 73/777; 901/46

(58) Field of Classification Search .................... 73/777, 73/841, 846; 310/338; 901/46
See application file for complete search history.

(56) References Cited

U.S. PATENT DOCUMENTS

| | | | |
|---|---|---|---|
| 4,651,120 A * | 3/1987 | Aagard | 338/4 |
| 4,745,812 A * | 5/1988 | Amazeen et al. | 73/862.041 |
| 5,178,016 A * | 1/1993 | Dauenhauer et al. | 73/727 |
| 6,877,385 B2 * | 4/2005 | Fang et al. | 73/777 |
| 7,201,063 B2 * | 4/2007 | Taylor | 73/841 |
| 7,441,470 B2 * | 10/2008 | Morimoto | 73/862.045 |
| 7,658,119 B2 * | 2/2010 | Loeb et al. | 73/862.046 |
| 8,004,052 B2 * | 8/2011 | Vaganov | 257/415 |
| 8,158,533 B2 * | 4/2012 | Chuang | 438/754 |
| 2007/0227267 A1 * | 10/2007 | Loeb et al. | 73/862.046 |
| 2009/0133508 A1 * | 5/2009 | Johansson et al. | 73/862.046 |
| 2009/0272201 A1 * | 11/2009 | Loeb et al. | 73/862.041 |
| 2010/0139418 A1 * | 6/2010 | Loeb et al. | 73/862.046 |
| 2010/0207490 A1 * | 8/2010 | Chuang | 310/338 |

FOREIGN PATENT DOCUMENTS

| | | |
|---|---|---|
| JP | 2006-208248 | 8/2006 |
| JP | 2009-267935 | 8/2006 |

* cited by examiner

*Primary Examiner* — Lisa Caputo
*Assistant Examiner* — Jonathan Dunlap
(74) *Attorney, Agent, or Firm* — Harness, Dickey & Pierce, P.L.C.

(57) ABSTRACT

A shear force detection device for detecting a shear force includes: a support body including an opening defined by a pair of straight parts perpendicular to a detection direction of the shear force and parallel to each other; a support film on the support body and closing the opening, the support film having flexibility; a piezoelectric part on the support film and extending astride an inside and outside of the opening and along at least one of the pair of straight parts of the opening when viewed in a plane in which the support body is seen in a substrate thickness direction, the piezoelectric part being bendable to output an electric signal; and an elastic layer covering the piezoelectric part and the support film.

3 Claims, 20 Drawing Sheets

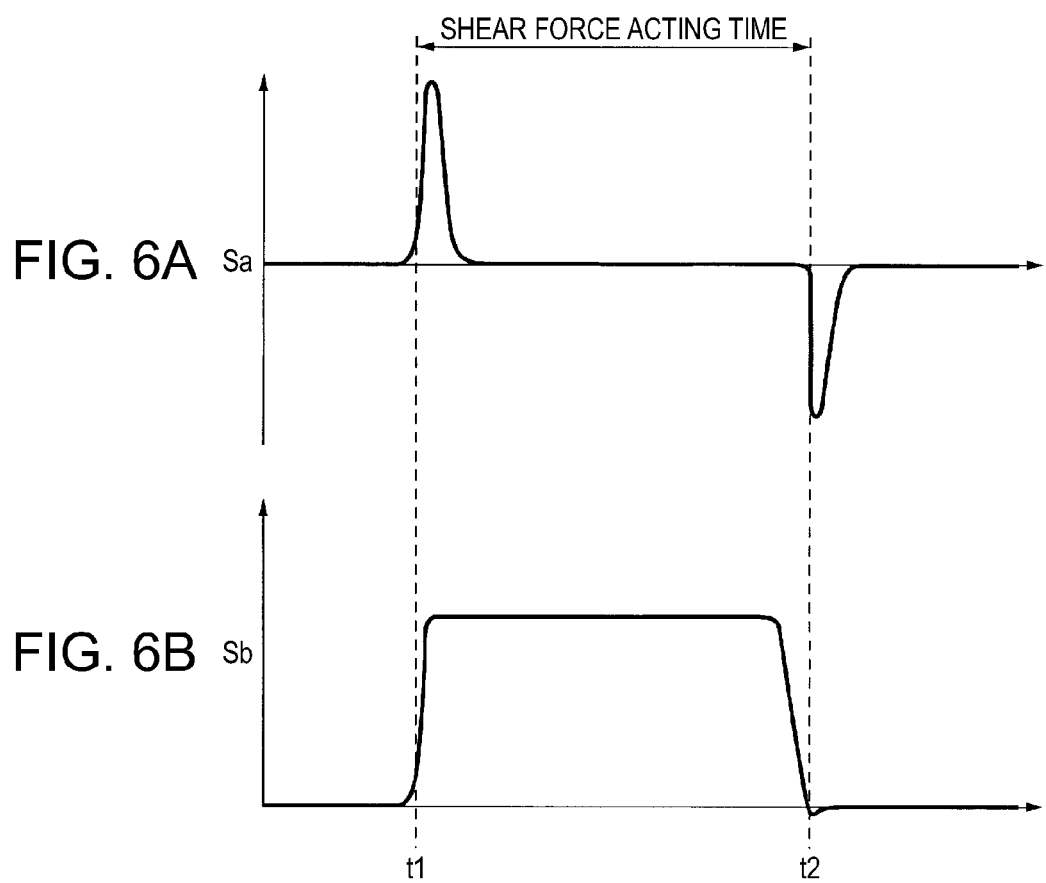

SHEAR FORCE DETECTION DEVICE, TACTILE SENSOR AND GRASPING APPARATUS

This application claims priority to Japanese Patent Application No. 2009-267935 filed Nov. 25, 2009 which is hereby expressly incorporated by reference herein in its entirety.

BACKGROUND

1. Technical Field

The present invention relates to a shear force detection device to detect stress in a shear direction, a tactile sensor including the shear force detection device and a grasping apparatus including the tactile sensor.

2. Related Art

A known grasping apparatus uses a robot arm, robot hand, robot manipulator or the like to grasp and lift an object whose weight and friction coefficient are unknown. To grasp the object without damaging or dropping the object, it is necessary to detect a force (positive pressure) acting in a direction perpendicular to the grasping surface and a force (shear force) acting in a surface direction (shear direction) of the grasping surface. A known sensor is used to detect these forces (see, for example, JP-A-2006-208248).

The tactile sensor disclosed in JP-A-2006-208248 has a cantilever structural body extending from an edge portion of an opening opened in a sensor substrate, and this structural body includes a plate-shaped sensitive part, and a hinge part to couple the sensitive part and the sensor substrate. A conductive magnetic film is formed on the sensitive part of the structural body, a piezoresistive film is formed on the hinge part, and the conductive magnetic film and the piezoresistive film are electrically connected. Further, an electrode is provided on the hinge part, and when the hinge part is bent by pressure, a current generated in the piezoresistance of the hinge part flows from the electrode. In this tactile sensor, plural such structural bodies are formed on the sensor substrate, some of these structural bodies are erected with respect to the sensor substrate, and the others are kept in parallel to the sensor substrate. Still further, an elastic body is provided on the sensor substrate, and the erected structural body is embedded in the elastic body. As such, the erected structural body can measure the shear force, and the structural body parallel to the substrate surface can measure the positive pressure.

In order to manufacture the tactile sensor as stated above, a P-type resistance region is formed in the surface of the sensor substrate by a heat diffusion method or the like, and a conductive magnetic layer is patterned by sputtering. Then, the conductive magnetic layer is used as a mask, an impurity layer and a Si layer are removed by ion etching, and further, the conductive magnetic film formed on the surface of the hinge part is etched. Thereafter, an opening part for shaping the outer shape of the structural body is formed by reactive ion etching or the like. Some of the plural structural bodies are erected by applying a magnetic field from the rear side of the sensor substrate, and the tactile sensor is manufactured.

The tactile sensor as disclosed in JP-A-2006-208248 has a complicated three-dimensional structure in which the cantilever structural body is erected, and the manufacturing thereof includes a complicated manufacturing process in which the magnetic field is applied to bend the cantilever structural body. Accordingly, the productivity is poor.

SUMMARY

An advantage of some aspects of the invention is to provide a shear force detection device capable of measuring shear force and having a simple structure, a tactile sensor and a grasping apparatus.

According to a first aspect of the invention, there is provided a shear force detection device for detecting a shear force, including a support body including an opening part having a pair of straight parts perpendicular to a detection direction of the shear force and parallel to each other, a support film formed on the support body to close the opening part and having flexibility, a piezoelectric part that is provided on the support film to extend astride the inside and outside of the opening part and along at least one of the pair of straight parts of the opening part when viewed in a plane in which the support body is seen in a substrate thickness direction, and is bent to output an electric signal, and an elastic layer to cover the piezoelectric part and the support film.

According to the first aspect of the invention, in the shear force detection device, the support film is formed on the support body in the state of closing the opening part, the piezoelectric part is laminated on the support film to extend astride the inside and outside of the opening part, and the elastic layer is further laminated on the upper layer thereof. Here, in the following description, the support film at the region in the opening part is called a membrane.

In the shear force detection device as stated above, when an object contacts with the elastic film, and a force is applied in a direction perpendicular to one direction of the opening part, a distortion occurs in the elastic layer. The entire membrane is distorted by the distortion of the elastic layer, and an electric signal (current) is outputted from the piezoelectric part. Accordingly, for example, when the shear force detection device as stated above is provided on the grasping surface for grasping an object, the shear force applied to the grasping surface from the contacted object can be measured by the electric signal outputted from the shear force detection device.

According to the first aspect of the invention, since the shear force detection device has the structure in which the support film, the piezoelectric part and the elastic layer are laminated on the support body, a complicated manufacturing method, such as applying a magnetic field to process a part of structure, is not required, and the shear force detection device can be manufactured by the simple method of laminating the respective components. Accordingly, the productivity of the shear force detection device becomes excellent, and the cost required for manufacturing can also be reduced. For example, in the structure in which the cantilever structural body is erected, since the structural body is erected, the thickness is increased. However, according to the first aspect of the invention, since the film-like support film, the piezoelectric part and the elastic layer are laminated on the support body, the increase of the thickness can be suppressed, and the shear force detection device can be miniaturized.

It is preferable that in the shear force detection device, the piezoelectric part and the opening part are formed to have a rectangular shape in which a length of a long side is larger than a length of a short side when viewed in the plane, the straight part in the opening part is the long side of the opening part, and a piezoelectric body longitudinal direction along the long side of the piezoelectric part and an opening part longitudinal direction along the long side of the opening part are the same direction.

When the opening part is formed to have the rectangular shape in the support body, when a shear force in the direction along the longitudinal direction of the opening part is received from an object brought into contact with the elastic layer, it is difficult to cause a distortion in the membrane. When a shear force in the direction perpendicular to the longitudinal direction of the opening part is received, it is easy to cause a distortion in the membrane in the direction perpendicular to the longitudinal direction.

At this time, when the piezoelectric part is provided at one side edge of the opening part along the longitudinal direction, and the longitudinal direction of the opening part and the longitudinal direction of the piezoelectric part are made coincident to each other. As a result, even when any position of the membrane is distorted, the piezoelectric part can detect the distortion. When the piezoelectric part is arranged so that the longitudinal direction thereof is perpendicular to the longitudinal direction of the opening part, there is a concern that the piezoelectric part inhibits the distortion of the support film, and it becomes difficult to detect the shear force at high accuracy. On the other hand, as stated above, in the structure in which the longitudinal direction of the piezoelectric part and the longitudinal direction of the opening part are made coincident, the piezoelectric part does not inhibit the distortion of the support film, and the support film can be distorted according to the shear force from the object. Accordingly, it becomes possible to further improve the detection accuracy of the shear force.

The shear force detection device may include a compliance part that is provided in parallel to the straight part at a center part of the opening part in the detection direction, and, when viewed in a section in which the shear force detection device is seen in a straight direction of the straight part, generates an inflection point in a deformed state of the support film when the shear force is applied along the shear direction.

Here, the compliance part may be formed such that for example, a groove is formed in the support film in parallel to the straight part at a center position in the shear direction and the thickness is made thinner than that of another part of the membrane. Alternatively, a portion where a laminate body is not provided may be made the compliance part according to the formation position of the laminate body, such as, for example, the piezoelectric part or a reinforcing film, formed on the support film. Further, the compliance part may be formed by causing a difference to occur in the total film thickness between the laminate body, such as, for example, the piezoelectric part or the reinforcing part formed on the support film, and the support film. That is, the compliance part may have any structure as long as the inflection point is generated in the membrane.

When an object contacts with the elastic layer and a shear force is applied, for example, when the straight part of the opening part is made a first side and a second side, and the shear force is applied in the detection direction directed from the first side to the second side, a force as described below acts in the elastic layer. That is, on the side of the second side of the elastic layer, a swelling force in the opposite direction to one surface on which the support body is provided occurs, and on the side of the first side, an entering force into the opening part of the support body occurs. Here, when the compliance part is provided, a displacement along the axial direction (normal direction to the surface direction of the support film) of the opening part at the compliance part becomes small, the compliance part is kept at almost the constant position, and the compliance part expands and contracts, so that the membrane is distorted while the compliance part is made the inflection point. As such, with respect to the compliance part, the membrane is distorted into a concave shape toward the opening part side on the side of the first side of the membrane, and the membrane is distorted into a convex shape in the direction of separating from the support body on the side of the second side of the membrane. Accordingly, as a whole, the distortion is formed which is substantially point-symmetric while the compliance part is made substantially the center. That is, when viewed in the section in which the support film is seen in the straight direction of the straight part, the support film is deformed into a sine wave shape with one wavelength while the compliance part is substantially the center. When such a distortion is formed, for example, as compared with a case where the entire membrane enters the opening part side and is deformed into a sine waveform shape with a half wavelength, the displacement amount of the piezoelectric part can be increased, and the electric signal outputted from the piezoelectric part is also increased. By acquiring the large signal value as stated above, the shear force detection with less influence of noise can be performed at higher accuracy.

It is preferable that in the shear force detection device, the support body includes a support reinforcing part provided at the center of the opening part in the detection direction and in parallel to the straight part, and the compliance part is provided on the support reinforcing part.

In this case, since the compliance part provided on the support reinforcing part is held by the support reinforcing film, even if the shear force is applied, it is held at a constant position. Thus, for example, when the straight part of the opening part is made a first side and a second side, and the shear force is applied in the detection direction directed from the first side to the second side, with respect to the compliance part, the distortion shape of the membrane on the side of the first side and the distortion shape of the membrane on the side of the second side can be made more accurately symmetric with each other.

Here, when viewed in the section in which the shear force detection device is seen in the straight direction of the straight part, when the distortion of the membrane does not become point-symmetric between the first side and the second side, for example, when the distortion on the side of the first side is small, the electric signal outputted from the piezoelectric part provided along the first side becomes low, and the detection accuracy of the shear force is reduced. On the other hand, in the aspect of the invention, the compliance part is held at the constant position by the support reinforcing part, and the distortion of the membrane can be made substantially point-symmetric with respect to the compliance part. Thus, the distortion amount on the side of the first side and that on the side of the second side become the same value. Accordingly, even when the piezoelectric part is formed on the side of the first side or formed on the side of the second side, the distortion amount of the membrane can be detected at high accuracy.

It is preferable that in the shear force detection device, the piezoelectric part is provided on each of both the pair of straight parts of the opening part.

When the compliance part is formed as stated above, when viewed in the section along the straight direction of the straight part, while the compliance part is made the inflection point, the distortion shape that is more point-symmetric between the first side and the second side of the membrane is formed. Accordingly, when the piezoelectric part is provided on each of the first side and the second side, and the distortion is detected by the two piezoelectric parts, an accurate electric signal corresponding to the distortion of the membrane can be obtained.

It is preferable that the shear force detection device includes an arithmetic circuit to output at least one of the difference and the sum of the electric signals outputted from the two piezoelectric parts.

When the piezoelectric part is formed on each of the first side and the second side as stated above, when a shear force is applied, the distortion which is substantially point-symmetric between the first side and the second side of the membrane is formed. Accordingly, the electric signal corresponding to the distortion amount is outputted from each of the piezoelectric part provided on the first side and the piezoelectric part provided on the second side. Accordingly, when the absolute values of the electric signals outputted from these piezoelectric parts are added, a larger electric signal can be obtained, and the shear force detection with higher accuracy can be performed.

Here, in order to obtain the sum of the absolute values of the electric signals outputted from the respective piezoelectric parts, an addition circuit may be used or a subtraction circuit may be used.

The piezoelectric part is formed of a piezoelectric film, an upper electrode formed on the upper surface of the film, and a lower electrode formed on the lower surface of the film. Here, when the addition circuit is used, the upper electrode of the piezoelectric part at the first side and the lower electrode of the piezoelectric part at the second side are connected to each other by a first connection line, and the lower electrode of the piezoelectric part at the first side and the upper electrode of the piezoelectric part at the second side are connected to each other by a second connection line. The first connection line and the second connection line are connected to the addition circuit. When the subtraction circuit is used, the upper electrode of the piezoelectric part at the first side and the upper electrode of the piezoelectric part at the second side are connected to each other by a first connection line, and the lower electrode of the piezoelectric part at the first side and the lower electrode of the piezoelectric part at the second side are connected to each other by a second connection line. The first connection line and the second connection line are connected to the subtraction circuit.

As described above, since the distortion directions in the respective piezoelectric parts are opposite to each other, the positive and negative signs of the electric signal outputted from the piezoelectric part at the first side and the electric signal outputted from the piezoelectric part at the second side are opposite to each other. On the other hand, when the addition circuit or the subtraction circuit is used, the positive and negative signs of the respective electric signals are uniformed, and the sum of the absolute values of the respective electric signals can be calculated.

It is preferable that in the shear force detection device, the elastic layer includes a plurality of elastic members provided along the detection direction and having rigidity higher than the support film.

Here, the elastic member may be formed into a plate shape and is disposed such that the plate surface direction is parallel to the straight direction of the straight part, and the plate thickness direction is the detection direction, or may be constructed such that a plurality of rod-shaped members are erected in the membrane.

In the structure using the elastic members as stated above, when an object contacts with the elastic member and a shear force acts, the respective elastic members are inclined by moment force. Then, the coupling part between the elastic member and the support film is inclined by the inclination of the elastic member, and distortion occurs in the membrane. In the structure as stated above, the distortion amount of the membrane can be increased by using the moment force, and a larger electric signal can be outputted from the piezoelectric part.

According to a second aspect of the invention, there is provided a tactile sensor including a plurality of the foregoing shear force detection devices, and including a first direction shear force detecting part in which the straight part of the shear force detection device is provided along a specified first direction, and a second direction shear force detecting part in which the straight part of the shear force detection device is provided along a second direction different from the first direction.

In the shear force detection device as described above, a direction perpendicular to the straight part of the opening part in which the piezoelectric part is provided is the detection direction, and the shear force acting in this detection direction is detected. Accordingly, as described above, by providing the first direction shear force detecting part and the second direction shear force detecting part in which the straight parts are different from each other, the shear forces in different directions can be detected. By providing the plurality of such shear force detection devices, shear forces acting in all directions in the sensor surface on which the tactile sensor is provided can be detected. As described above, each of the shear force detection devices has the simple structure in which the support film, the piezoelectric part and the elastic layer are laminated on the support body, and the device can be easily manufactured. Thus, the tactile sensor using such shear force detection devices can also be made to have a simple structure, and the manufacturing becomes easy.

It is preferable that the tactile sensor includes a positive pressure detecting part to detect a pressure in a contact direction perpendicular to a surface direction of the support film at a time of contact with an object, the positive pressure detecting part includes a positive pressure detection opening part opened in the support body, a support film to close the positive pressure detection opening part and having flexibility, a positive pressure detection piezoelectric body that is provided on the support film and inside the positive pressure detection opening part when viewed in a plane in which the support body is seen in a substrate thickness direction, and is bent to output an electric signal, and an elastic layer to cover the positive pressure piezoelectric body and the support film.

In this case, in addition to the shear force acting on the sensor surface, a pressure (hereinafter referred to as a positive pressure) in the direction perpendicular to the sensor surface can also be detected. By using the tactile sensor as stated above, for example, in an apparatus for grasping a material body, the positive pressure and the slide force can be measured at the time of grasping. When a grasping operation is controlled based on the electric signal outputted from the tactile sensor, the grasped object can be grasped without damaging and dropping the object. Further, similarly to the shear force detection device, the positive pressure detecting part has the structure in which the support film, the positive pressure detection piezoelectric body and the elastic layer are provided on the support body, and has the simple laminate structure similar to the foregoing shear force detection device. Accordingly, the positive pressure detecting part can be manufactured simultaneously with the manufacturing of the shear force detection device, and the manufacturing efficiency of the tactile sensor can be more improved.

According to a third aspect of the invention, there is provided a grasping apparatus including the foregoing tactile sensor and grasps the object, and including at least a pair of grasping arms which grasp the object and in which the tactile sensor is provided on a contact surface to contact with the object, a grasping detection unit that detects a slide state of the object based on an electric signal outputted from the tactile sensor, and a drive control unit that controls driving of the grasping arms based on the slide state.

In this case, as described above, the shear force when the grasped object is grasped is measured, so that it is possible to measure whether the object is in a state of sliding down from the grasping arm or in a state where the object is grasped. That is, in the operation of grasping the object, in the state where the object is not sufficiently grasped, a shear force corresponding to a dynamic friction force acts, and as the grasping force is increased, this shear force becomes large. On the other hand, the grasping force is increased, and in the state where a shear force corresponding to a static friction force is detected, the grasping of the object is completed, and even when the grasping force is increased, the static friction force is constant, and the shear force is not changed. Accordingly, for example, the grasping force of the object is gradually increased, and when the time point when the shear force is not changed is detected, the object can be grasped by the minimum grasping force without damaging the object.

As described above, the tactile sensor constituting the grasping apparatus has the simple structure including the shear force detection device having the simple structure in which the support film, the piezoelectric part and the elastic layer are laminated on the support body, and can be easily manufactured. Thus, the grasping apparatus using the tactile sensor as described above can also be similarly made to have the simple structure, and the manufacturing also becomes easy.

BRIEF DESCRIPTION OF THE DRAWINGS

The invention will be described with reference to the accompanying drawings, wherein like numbers reference like elements.

FIGS. 3A and 3B are views showing states where a grasped object contacts with the shear force detection device and a shear force is applied, in which FIG. 3A is a view showing a state before a shear force detection membrane is deformed and FIG. 3B is a view showing a state where the shear force detection membrane is deformed by the shear force.

FIGS. 4A to 4C are views showing a potential difference generated in a shear force detection piezoelectric film, in which FIG. 4A is a view showing a state where the shear force detection piezoelectric film is not deformed, FIG. 4B is a view showing a state where the shear force detection piezoelectric film is extended, and FIG. 4C is a view showing a state where the shear force detection piezoelectric film is compressed.

FIGS. 6A and 6B are views showing an example of a waveform of an electric signal outputted from the shear force detection device, in which FIG. 6A is a view showing the waveform at a point Sa in FIG. 5, and FIG. 6B is a view showing the waveform at a point Sb in FIG. 5.

FIGS. 7A and 7B are views showing a shear force detection device of a second embodiment, in which FIG. 7A is a sectional view showing the shear force detection device cut along a short side direction of a shear force detection opening part, and FIG. 7B is a plan view of the shear force detection device.

FIGS. 8A and 8B are sectional views showing a shear force detection device of a third embodiment cut along a short side direction of a shear force detection opening part, in which FIG. 8A is a view showing a state where a shear force is not applied, and FIG. 8B is a view showing a state where a shear force is applied.

FIGS. 11A and 11B are views showing a schematic structure of a positive pressure detecting part of the fourth embodiment, in which FIG. 11A is a sectional view of the positive pressure detecting part cut along a substrate thickness direction of a sensor substrate, and FIG. 11B is a plan view of the positive pressure detecting part when viewed in a sensor plane.

FIGS. 17A and 17B are views showing a shear force detection device having a bimorph shear force detection piezoelectric body of a still another embodiment, in which FIG. 17A is a sectional view along a short side direction, and FIG. 17B is a plan view when viewed in a sensor plane.

FIGS. 18A and 18B are views showing a structure of a shear force detection device of a still another embodiment, in which FIG. 18A is a sectional view cut along a short side direction, and FIG. 18B is a plan view when viewed in a sensor plane.

DESCRIPTION OF EXEMPLARY EMBODIMENTS

First Embodiment

Hereinafter, a shear force detection device of a first embodiment of the invention will be described with reference to the drawings.

1. Structure of the Shear Force Detection Device

Figure 1:
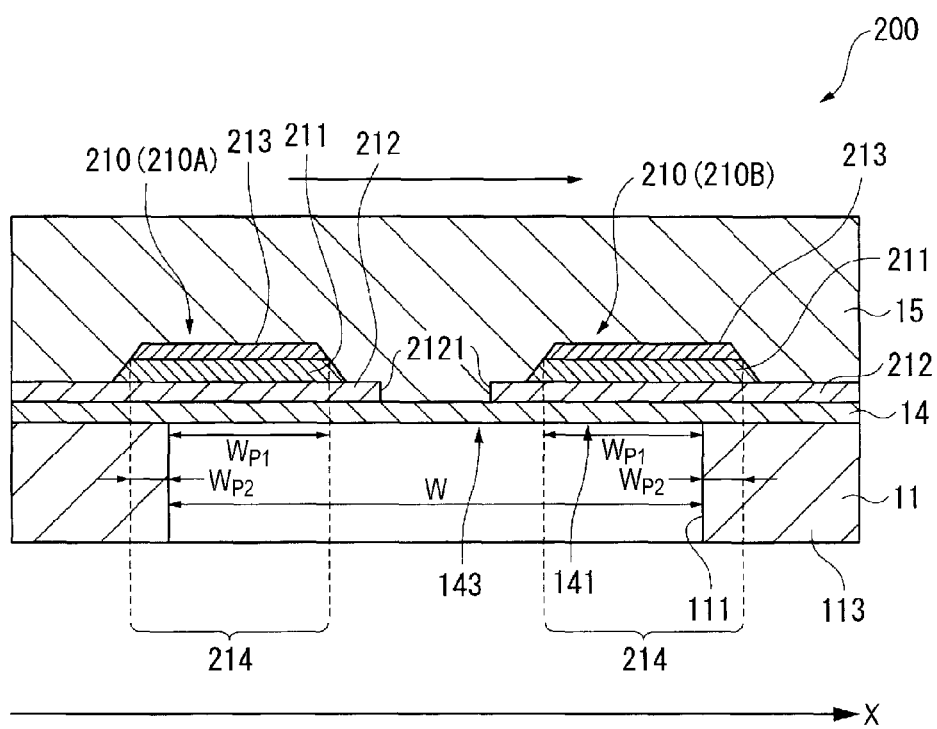
FIG. 1 is a sectional view showing a schematic structure of a shear force detection device of a first embodiment of the invention.
Figure 2:
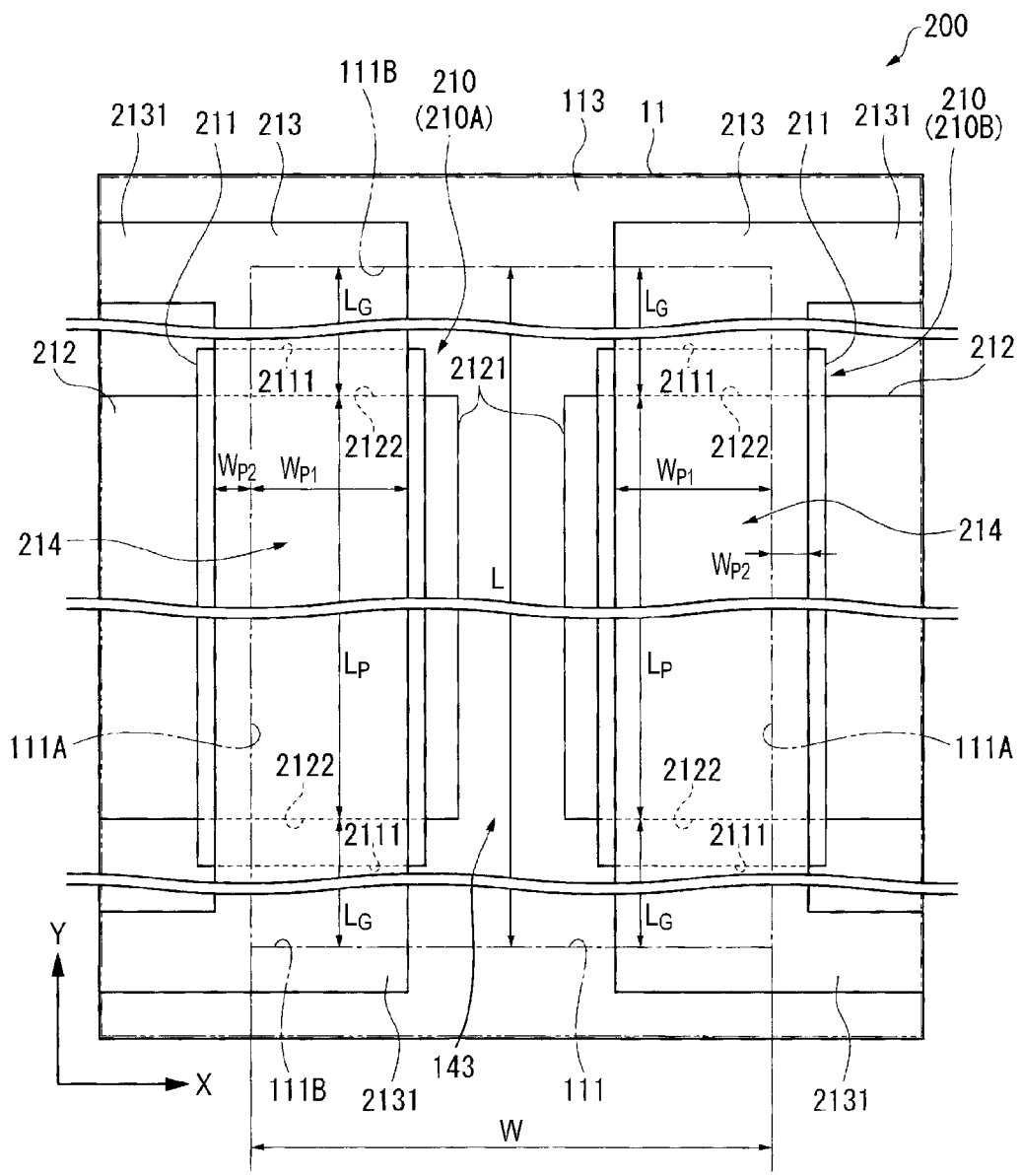
FIG. 2 is a plan view of the shear force detection device of the first embodiment.

FIG. 1 is a sectional view showing a schematic structure of a shear force detection device 200 of this embodiment, and FIG. 2 is a plan view of the shear force detection device 200.

As shown in FIG. 1, the shear force detection device 200 is constructed such that a support film 14, a shear force detection piezoelectric body 210 constituting a piezoelectric part according to the invention, and an elastic film 15 as an elastic layer are laminated on a sensor substrate 11 as a support body. The shear force detection device 200 is the device to detect a shear force when an object contacts with the elastic film 15 and the object moves in a shear direction.

The sensor substrate 11 is formed of, for example, Si, and its thickness is, for example, 200 μm. As shown in FIG. 1 and FIG. 2, a shear force detection opening part 111 as an opening part according to the invention is formed in the sensor substrate 11. The shear force detection opening part 111 is formed to be rectangular when viewed in a plane, and a long side constituting the rectangle (a long sidewall) constitutes a straight part according to the invention. Here, a direction along the long side of the shear force detection opening part 111 is a straight direction of the straight part according to the invention, and this direction is set as a Y direction. A direction along a short side of the shear force detection opening part 111 (along the short sidewall) is a detection direction in the invention, and this detection direction is set as an X direction.

In this embodiment, the shear force detection opening part 111 is formed to have a long side size L of 500 μm and a short side size W of 100 μm. Incidentally, the size of the shear force detection opening part 111 is preferably formed so that the ratio of the long side size L to the short side size W is L/W≧2, and no limitation is made to the above size. That is, in the shear force detection device 200, for example, when the shear force detection opening part 111 is formed so that the ratio of the long side size L to the short side size W is L/W<2, by the distortion of the elastic film 15 in the Y direction, the support film 14 is also distorted in the Y direction, and the detection of the distortion in only the X direction becomes difficult. On the other hand, when the ratio of the long side size L to the short side size W is L/W≧2, the distortion of the support film 14 in the Y direction can be reduced, and the shear force in the X direction can be detected with high accuracy.

Although not shown, the support film 14 is formed of two layers including a $SiO_2$ layer of a thickness of, for example, 3 μm laminated on the sensor substrate 11 and a $ZrO_2$ layer of a thickness of, for example, 400 nm laminated on the $SiO_2$ layer. Here, the $ZrO_2$ layer is a layer formed to prevent peeling of a shear force detection piezoelectric film 211 at the time of firing of the shear force detection piezoelectric body 210 described later. That is, when the shear force detection piezoelectric film 211 is formed of, for example, PZT, when the $ZrO_2$ layer is not formed at the time of firing, Pb contained in the shear force detection piezoelectric film 211 is diffused into the $SiO_2$ layer, the melting point of the $SiO_2$ film is lowered, an air bubble is generated on the surface of the $SiO_2$ layer, and the PZT is peeled off by the air bubble. When the $ZrO_2$ layer is not provided, there is a problem that the distortion efficiency to the distortion of the shear force detection piezoelectric film 211 is reduced. On the other hand, when the $ZrO_2$ layer is formed on the $SiO_2$ layer, it becomes possible to avoid disadvantages such as the peeling of the shear force detection piezoelectric film 211 and the reduction of the distortion efficiency.

In the following description, when viewed in a sensor plane as shown in FIG. 2 (a plan view), an area of the support film 14, which closes the shear force detection opening part 111, is called a shear force detection membrane 141.

The shear force detection piezoelectric body 210 includes the film-like shear force detection piezoelectric film 211, and a shear force detection lower electrode 212 and a shear force detection upper electrode 213 which are respectively formed in the thickness direction of the shear force detection piezoelectric film 211.

The shear force detection piezoelectric film 211 is formed by forming a film of, for example, PZT (lead zirconate titanate) having a thickness of, for example, 500 nm. Incidentally, in this embodiment, although PZT is used for the shear force detection piezoelectric film 211, any material may be used as long as an electric charge can be generated by stress change of the film. For example, lead titanate ($PbTiO_3$), lead zirconate ($PbZrO_3$), lanthanum lead titanate (($Pb$, $La$)$TiO_3$), aluminum nitride (AlN), zinc oxide (ZnO), polyvinylidene fluoride (PVDF) or the like may be used. In the shear force detection piezoelectric film 211, when the support film is distorted by the shear force, a potential difference is generated between the shear force detection lower electrode 212 and the shear force detection upper electrode 213 correspondingly to the distortion amount. As such, a current from the shear force detection piezoelectric film 211 flows to the shear force detection lower electrode 212 and the shear force detection upper electrode 213, and an electric signal is outputted.

The shear force detection lower electrode 212 and the shear force detection upper electrode 213 are electrodes formed at both sides of the shear force detection piezoelectric films 211 in the film thickness direction. The shear force detection lower electrode 212 is formed on the surface of the shear force detection piezoelectric film 211 facing the shear force detection membrane 141, and the shear force detection upper electrode 213 is formed on the surface opposite to the surface on which the shear force detection lower electrode 212 is formed.

The shear force detection lower electrode 212 is the film-like electrode having a thickness of, for example, 200 nm. Any material may be used for the shear force detection lower electrode 212 as long as the material is a conductive thin film having conductivity. In this embodiment, for example, a laminate structure film of Ti/Ir/Pt/Ti is used.

The shear force detection upper electrode 213 is the film-like electrode having a thickness of, for example, 50 nm. Any material may be used for the shear force detection upper electrode 213 as long as the material is a conductive thin film. In this embodiment, an Ir thin film is used.

The shear force detection piezoelectric body 210 is formed into a rectangular shape having a longest length in the same direction as the longitudinal direction (Y direction) of the shear force detection opening part 111, and a pair of the shear force detection piezoelectric bodies are provided along the long sides 111A of the shear force detection opening part 111. When viewed in a plane, each of the shear force detection piezoelectric bodies 210 (210A, 210B) is arranged across the long side 111A of the shear force detection opening part 111 so as to extend astride the inside and outside of the shear force detection opening part 111.

In the shear force detection piezoelectric body 210, the shear force detection lower electrode 212 is formed along the X direction from a substrate part 113 to the shear force detection membrane 141. Specifically, in the shear force detection piezoelectric body 210A arranged on a −X direction side, the shear force detection lower electrode 212 is formed to slightly protrude in a +X direction from an edge of the shear force detection piezoelectric film 211 on a +X side. In the shear force detection piezoelectric body 210B arranged on the +X direction side, the shear force detection lower electrode 212 is formed to slightly protrude in the −X direction from an edge of the shear force detection piezoelectric film 211 on the −X side. Here, a distance between an edge (lower electrode tip edge 2121) of the shear force detection lower electrode 212 along the Y direction and the long side 111A of the shear force detection opening part 111 is smaller than ½ of the short side size W of the shear force detection opening part 111, and is, for example, 40 μm. Accordingly, a gap of a specified size (for example, 20 μm) is formed between the shear force detection lower electrode 212 arranged in the shear force detection membrane 141 from the −X direction and the shear force detection lower electrode 212 arranged in the shear force detection membrane 141 from the +X direction. In this portion, the shear force detection piezoelectric film 211 and the shear force detection upper electrode 213 as well as the shear force detection lower electrode 212 are not laminated, and this portion becomes a compliance part 143 which is softest and easily deformed in the support film 14.

The shear force detection piezoelectric film 211 extending in the Y direction is formed on the shear force detection lower electrode 212 to cover a portion between a pair of edges (lower electrode side edges 2122) of the shear force detection lower electrode 212 along the X direction. Further, the shear force detection upper electrode 213 extending in the Y direction is formed on the shear force detection piezoelectric film 211 to cover a portion between a pair of edges (piezoelectric film side edges 2111) of the shear force detection piezoelectric film 211 along the X direction. The shear force detection upper electrode 213 is formed, for example, between a pair of opposite short sides 111B of the shear force detection opening part 111, and extends in the X direction from the vicinity of the short side 111B to form a leader part 2131. In the shear force detection piezoelectric body 210 as stated above, since there is no portion where the shear force detection lower electrode 212 and the shear force detection upper electrode 213 come in direct contact with each other, the electric signal outputted from the shear force detection piezoelectric body 210 can be easily extracted without covering the respective electrodes 212 and 213 with insulating films.

In the shear force detection piezoelectric body 210, a portion where the shear force detection lower electrode 212, the shear force detection piezoelectric film 211 and the shear force detection upper electrode 213 overlap with each other in the film direction becomes a piezoelectric laminate part 214 to detect the distortion amount of the support film.

Here, the piezoelectric laminate part 214 is formed into a rectangular shape having a longest length in the Y direction, and when viewed in a sensor plane as shown in FIG. 2 (a plan view), a length $L_p$ in the Y direction is smaller than a length L of the long side 111A of the shear force detection opening part 111, and a distance $L_G$ between an edge (lower electrode side edge 2122) along the X direction and the short side 111B of the shear force detection opening part 111 is formed to be larger than at least the short side size W of the shear force detection opening part 111. Incidentally, in this embodiment, the distance $L_G$ is formed to be 120 μm.

This is because when the distance $L_G$ is not larger than the short side size W of the shear force detection opening part 111, there is a concern that the distortion detection accuracy in the X direction is reduced. That is, in the rectangular shear force detection membrane 141, since the support film 14 on the short side 111B of the shear force detection opening part 111 is fixed to the substrate 113, even if the elastic film 15 is distorted, the support film 14 is not displaced. Accordingly, in the vicinity of the short side 111B, since distortion does not occur to the shear force, when the distortion of the support film 14 in this region is detected, it becomes difficult to measure an accurate shear force. On the other hand, as stated above, when the distance $L_G$ is larger than the short side size W of the shear force detection opening part 111, the distortion corresponding to the shear force can be generated in the support film 14, and the distortion in the Y direction is not generated in the support film 14 by the shear force in the X direction. Thus, the shear force can be measured at high accuracy.

Although the piezoelectric laminate part 214 is formed to extend astride the inside and outside of the shear force detection membrane 141, it is preferable that a size $W_{p1}$ of the piezoelectric laminate part 214 along the X direction in the shear force detection membrane 141 is formed to be equal to or less than ⅓ of a size $L_p$ of the piezoelectric laminate part 214 along the Y direction. For example, in this embodiment, the sizes are $W_{p1}$=30 μm and $L_p$=260 μm. This is because when the size $W_{p1}$ of the piezoelectric laminate part 214 along the X direction in the shear force detection membrane 141 is formed to be larger than ⅓ of the size $L_p$ of the piezoelectric laminate part 214 along the Y direction, the possibility that the influence of the shear force in the Y direction is received becomes high in the piezoelectric laminate part 214. On the other hand, as stated above, when the size of the piezoelectric laminate part 214 is formed so that $3W_{p1} \leq L_p$ is established, the influence of the shear force in the Y direction is removed, and it becomes possible to distort the support film 14 and the piezoelectric laminate part 214 by the shear force in the X direction.

In the piezoelectric laminate part 214, it is preferable that in the outside of the shear force detection membrane 141, a size $W_{p2}$ along the X direction is formed to be five or more times larger than the sum of the film thicknesses of the support film 14 and the piezoelectric laminate part 214. In this embodiment, the sum of the film thicknesses of the support film 14 and the piezoelectric laminate part 214 is about 4.15 μm, and the size $W_{p2}$ is, for example, 25 μm.

Here, when the size $W_{p2}$ of the piezoelectric laminate part 214 along the X direction in the outside of the shear force detection membrane 141 is less than five times as large as the sum of the film thicknesses of the support film 14 and the piezoelectric laminate part 214, there is a problem as described below. That is, when the shear force detection membrane 141 is deformed by the shear force, there occurs a moment force by which each layer is urged to enter the shear force detection opening part 111 by the shear force or a moment force by which each layer is urged to rise in a direction of separating from the shear force detection opening part 111. The moment forces act on each of the support film 14, the shear force detection lower electrode 212, the shear force detection piezoelectric film 211 and the shear force detection upper electrode 213, and deform the shear force detection membrane 141 and the shear force detection piezoelectric body 210. At this time, in the outside region of the shear force detection membrane 141 of the piezoelectric laminate part 214 in the shear force detection piezoelectric body 210, as a distance from the edge (long side 111A) of the shear force detection opening part 111 becomes large, the stress caused by the deformation of the shear force detection membrane 141 becomes small. Here, when the size $W_{p2}$, in the X direction, of the portion formed outside the shear force detection membrane 141 in the piezoelectric laminate part 214 is $W_{p2}$<5t (t denotes the sum of film thicknesses), since the stress caused by the deformation of the shear force detection membrane 141 can not be sufficiently received, the stable deformation of the shear force detection membrane 141 can not be obtained. There is a concern that the respective films 311, 312 and 313 constituting the shear force detection piezoelectric body 210 will peel. On the other hand, when the shear force detection piezoelectric body 210 is formed so that the size $W_{p2}$ is $W_{p2} \geq 5t$, the deformation of the shear force detection membrane 141 can be stabilized, and disadvantages such as peeling can be avoided.

The elastic film 15 is the film formed to cover the support film 14 and the shear force detection piezoelectric body 210. As the elastic film 15, for example, PDMS (PolyDiMethyl Siloxane) is used in this embodiment. However, no limitation is made to this, and the elastic film may be formed of another elastic material such as synthetic resin having elasticity. Although the thickness of the elastic film 15 is not particularly limited, the thickness is, for example, 300 μm.

The elastic film 15 functions as a protective film for the shear force detection piezoelectric body 210, and transmits the shear force applied to the elastic film 15 to the shear force detection membrane 141 and distorts it. The shear force detection membrane 141 is distorted by the distortion of the elastic film 15, so that the shear force detection piezoelectric body 210 is also distorted, and an electric signal corresponding to the distortion amount is outputted.

2. Operation of the Shear Force Detection Device

Next, the operation of the shear force detection device as described above will be described with reference to the drawings.

Figure 3A:
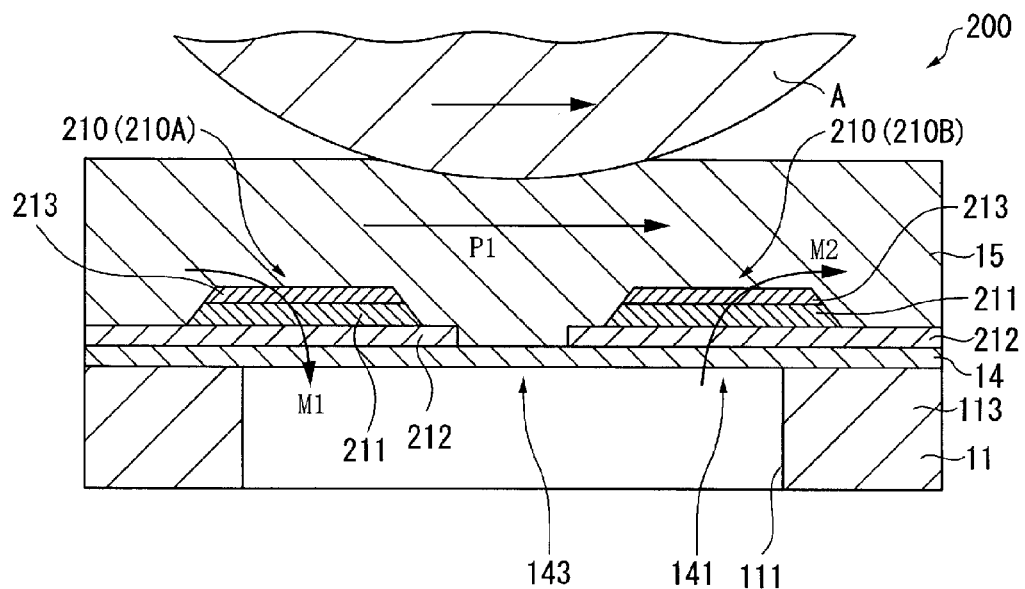
Figure 3B:
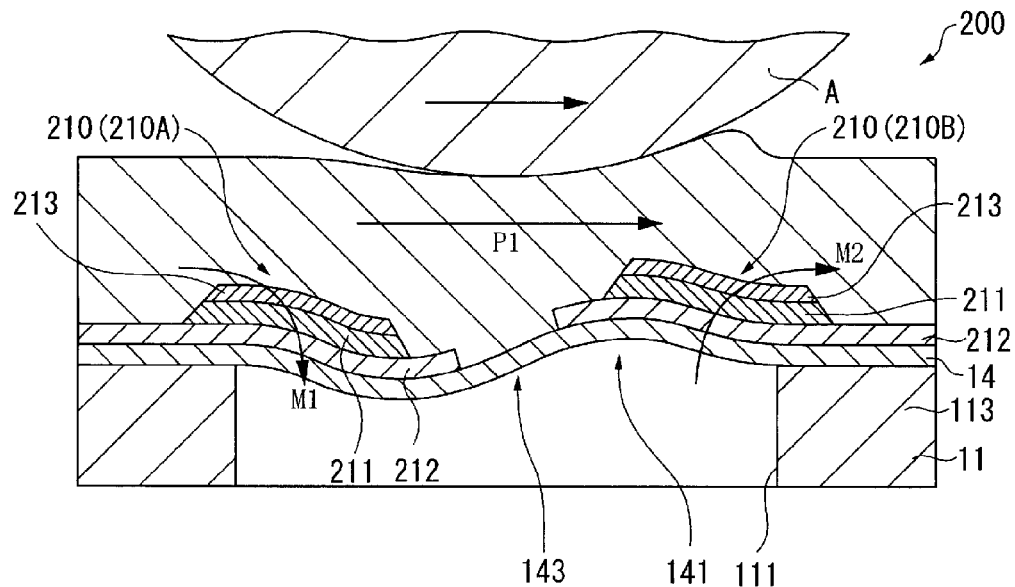

FIGS. 3A and 3B are views showing a state where a grasped object A contacts with the shear force detection device and stress (shear force) is applied in an arrow P1 direction, in which FIG. 3A is a view showing a state before the shear force detection membrane 141 is deformed and FIG. 3B is a view showing a state where the shear force detection membrane 141 is deformed by the shear force.

As shown in FIG. 3A, in the shear force detection device 200, when the object A contacts with the elastic film 15 and the shear force is applied in the arrow P1 direction, as shown in FIG. 3B, distortion occurs in the shear force detection membrane 141.

That is, when the shear force is generated in the elastic film 15, as indicated by an arrow M1, a downward moment force toward the shear force detection opening part 111 is generated on the −X side surface of the shear force detection membrane 141, and as indicated by an arrow M2, an upward moment force from the shear force detection opening part 111 is generated on the +X side surface.

At this time, since the compliance part 143 which has the film thickness smaller than that of the other part of the shear force detection membrane 141 and is soft is formed at the center position of the shear force detection membrane 141, the compliance part 143 becomes an inflection point, and the shear force detection membrane 141 is distorted into a sine waveform shape with one wavelength.

Figure 4A:
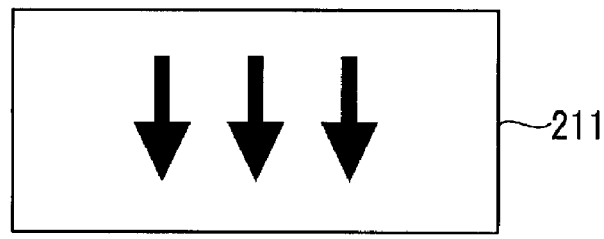
Figure 4B:
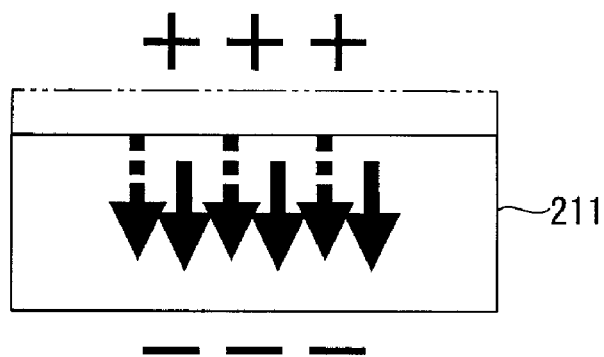
Figure 4C:
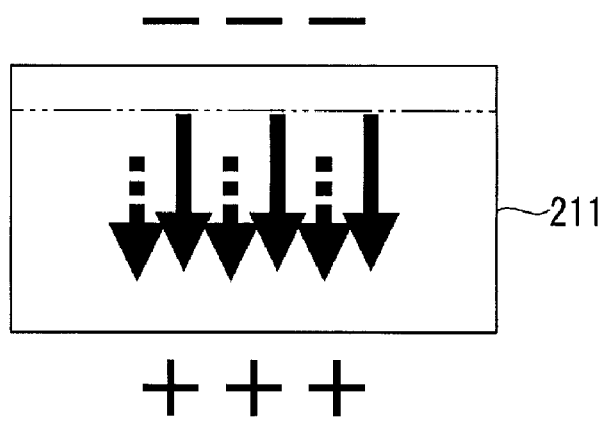

FIGS. 4A and 4B are views schematically showing a potential difference generated in the shear force detection piezoelectric film 211, in which FIG. 4A is a view showing a state where the shear force detection piezoelectric film 211 is not deformed, FIG. 4B is a view showing a state where the shear force detection piezoelectric film 211 is extended, and FIG. 4C is a view showing a state where the shear force detection piezoelectric film 211 is compressed.

In order to detect the shear force by the shear force detection device 200 as stated above, a voltage is previously applied between the shear force detection upper electrode 213 and the shear force detection lower electrode 212, and the polarization is caused as shown in FIG. 4A. In this state, when distortion occurs in the shear force detection membrane 141 as shown in FIG. 3B, a potential difference occurs in the shear force detection piezoelectric film 211.

Specifically, when the shear force as indicated by the arrow P1 of FIG. 3A is applied, similarly to the shear force detection membrane 141, the moment force as indicated by the arrow M1 is applied to the shear force detection piezoelectric film 211 of the shear force detection piezoelectric body 210 on the −X direction side of FIG. 3B. Thus, as shown in FIG. 4B, tensile stress is generated in the shear force detection piezoelectric film 211, and the film thickness becomes small. As such, the polarization moment is reduced in the shear force detection piezoelectric film 211, a positive charge is generated on the contact surface to the shear force detection upper electrode 213, and a negative charge is generated on the contact surface to the shear force detection lower electrode 212. Thus, a current flows in the direction from the shear force detection lower electrode 212 to the shear force detection upper electrode 213, and is outputted as an electric signal.

On the other hand, since the moment force as indicated by the arrow M2 is applied to the shear force detection piezoelectric film 211 of the shear force detection piezoelectric body 210 on the +X direction side of FIG. 3B, a compression stress is generated in the shear force detection piezoelectric film 211 as shown in FIG. 4C, and the film thickness becomes large. As such, the polarization moment is increased in the shear force detection piezoelectric film 211, a negative charge is generated on the shear force detection upper electrode 213 and a positive charge is generated on the shear force detection lower electrode 212. Thus, a current flows in the direction from the shear force detection upper electrode 213 to the shear force detection lower electrode 212 and is outputted as an electric signal.

3. Output Circuit of the Shear Force Detection Device

The shear force detection device 200 as described above includes an arithmetic circuit 220 to add the shear force detection signal outputted from the shear force detection piezoelectric body 210 on the −X direction side and the shear force detection signal outputted from the shear force detection piezoelectric body 210 on the +X direction side.

The arithmetic circuit 220 may be formed on, for example, the sensor substrate 11, or may be provided separately from the sensor substrate 11 and may be connected to the shear force detection lower electrode 212 and the shear force detection upper electrode 213 formed on the sensor substrate 11. Incidentally, when the arithmetic circuit is provided separately from the sensor substrate 11, it may be housed in, for example, an apparatus to which the shear force detection device 200 is attached.

Figure 5:
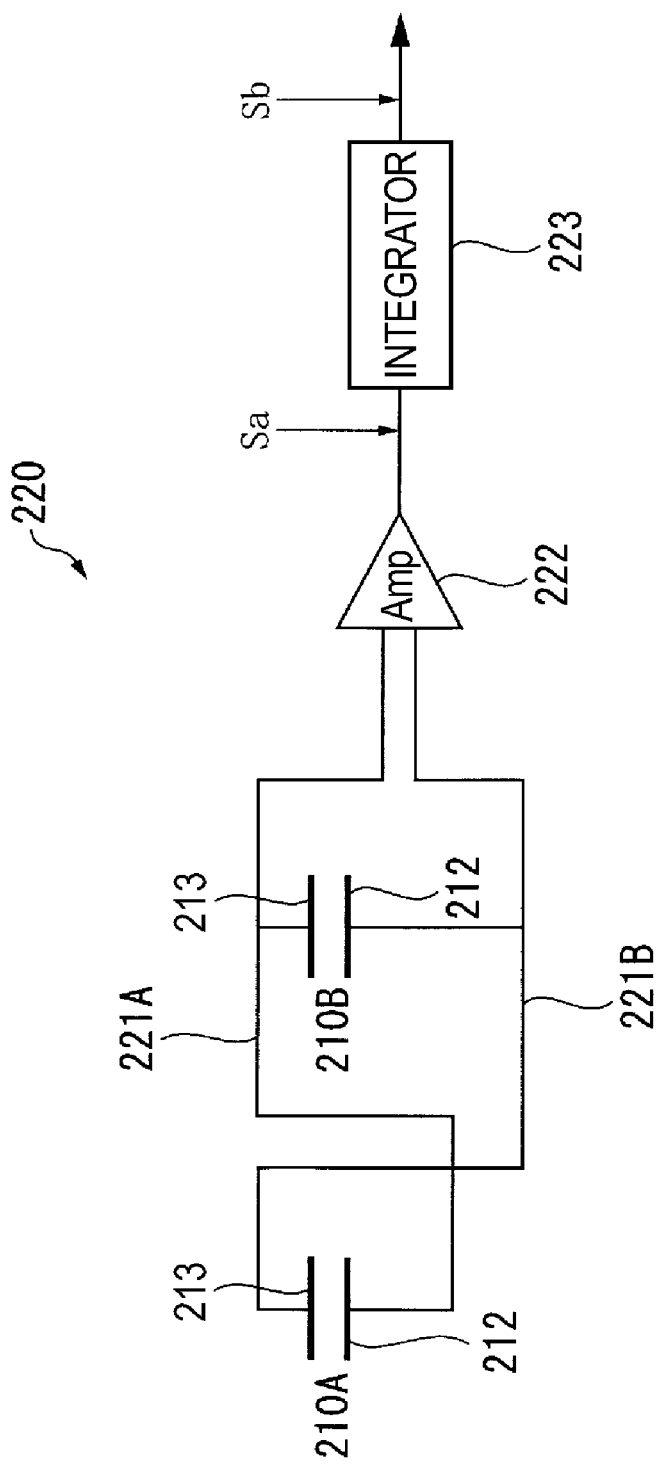
FIG. 5 is a circuit diagram showing a schematic structure of an arithmetic circuit of the shear force detection device of the first embodiment.

FIG. 5 is a circuit diagram showing a schematic structure of the arithmetic circuit 220 of the shear force detection device 200.

In the arithmetic circuit 220 of the shear force detection device 200 of this embodiment, a connection line 221A to connect the shear force detection lower electrode 212 of the shear force detection piezoelectric body 210A on the −X direction side and the shear force detection upper electrode 213 of the shear force detection piezoelectric body 210B on the +X direction side, and a connection line 221B to connect the shear force detection upper electrode 213 of the shear force detection piezoelectric body 210A on the −X direction side and the shear force detection lower electrode 212 of the shear force detection piezoelectric body 210B on the +X direction side are connected to an amplifier (Amp) 222.

Here, as shown in FIG. 3B, since the distortion direction is reversed between the shear force detection piezoelectric body 210A and the shear force detection piezoelectric body 210B, the currents outputted from the shear force detection piezoelectric body 210A and the shear force detection piezoelectric body 210B are reversed in positive and negative. Accordingly, the shear force detection upper electrode 213 of the shear force detection piezoelectric body 210A and the shear force detection lower electrode 212 of the shear force detection piezoelectric body 210B are connected, and the shear force detection lower electrode 212 of the shear force detection piezoelectric body 210A and the shear force detection upper electrode 213 of the shear force detection piezoelectric body 210B are connected. As a result, the positive and negative signs of the currents outputted from the shear force detection piezoelectric bodies 210A and 210B can be made the same sign.

When the currents outputted from the shear force detection piezoelectric bodies 210A and 210B are inputted to an integrator 223 after they are amplified by the amplifier 222, waveforms as shown in FIGS. 6A and 6B can be obtained.

FIG. 6A is a view showing the waveform at a point Sa in FIG. 5, and FIG. 6B is a view showing the waveform at a point Sb in FIG. 5.

The shear force detection device 200 outputs, for example, a positive electric signal as shown in FIG. 6A at timing t1 when the object A contacts with the elastic film 15 and the shear force is generated in the X direction. Since the elastic film 15 is returned to the original position at, for example, timing t2 when the object A is separated from the elastic film 15 and the shear force disappears, the shear force detection membrane 141 is also returned to the original position. A negative electric signal is outputted by the deformation of the shear force detection piezoelectric body 210 generated at this time. When the electric signals stated above are inputted to the integrator 223, a shear force detection signal as shown in FIG. 6B is obtained. In this shear force detection signal, the signal corresponding to the shear force is continuously outputted during the period in which the shear force is acting.

4. Operation and effect of the first embodiment

As described above, in the shear force detection device 200 of the first embodiment, the support film 14 is laminated on the sensor substrate 11 in which the shear force detection opening part 111 is formed. The shear force detection piezoelectric body 210 arranged along the long side 111A of the shear force detection opening part 111 and extending astride the inside and outside of the shear force detection membrane 141 is laminated on the support film 14, and the elastic film 15 is further laminated on the upper layer thereof. In the shear force detection device having the structure as stated above, when the shear force is applied to the elastic film 15, the shear force detection membrane 141 is distorted by the moment force, and the electric signal corresponding to the shear force is outputted from the shear force detection piezoelectric body 210. Accordingly, the shear force can be easily measured by detecting the electric signal stated above.

Since the structure is simple in which the support film 14, the shear force detection piezoelectric body 210 and the elastic film 15 are laminated on the sensor substrate 11, the respective layers can be easily formed by lamination through sputtering or the like or patterning through etching or the like. Accordingly, for example, it is unnecessary to perform processing such as to bend a part of the substrate in accordance with the direction of the shear force. The shear force detection device can be manufactured by a simple manufacturing process, and the manufacturing efficiency can be improved.

The shear force detection opening part 111 is formed to be rectangular, and the shear force detection piezoelectric body 210 is arranged along the long side 111A of the rectangle.

In the shear force detection membrane 141 formed on the shear force detection opening part 111 as stated above, the distortion in the long side direction becomes hard to occur. Accordingly, in the electric signal outputted from the shear force detection piezoelectric body 210, noise due to the distortion in the long side direction can be removed, and the shear force in the short side direction (X direction) as the detection direction can be detected at high accuracy.

The pair of shear force detection piezoelectric bodies 210A and 210B are provided correspondingly to the pair of the long sides 111A of the shear force detection opening part 111. The compliance part 143 where the shear force detection piezoelectric bodies 210A and 210B are not laminated is formed at the center of the shear force detection membrane 141.

Accordingly, in the shear force detection membrane 141, when viewed in a section as shown in FIG. 3B cut along the short side direction of the shear force detection opening part 111, the distortion which is point-symmetric with respect to the compliance part 143, that is, the distortion of the sine wave shape with one wavelength is generated. As such, an inclination angle in the distortion portion in the shear force detection membrane 141 becomes large, and the distortion amount of the shear force detection piezoelectric body 210 also becomes large. Accordingly, a larger electric signal can be outputted as the shear force detection signal, and the shear force detection accuracy can be improved.

The pair of the shear force detection piezoelectric bodies 210A and 210B are provided at both sides of the compliance part 143. Here, in the shear force detection membrane 141, when the shear force is applied, deformation substantially point-symmetric with respect to the compliance part 143 occurs. However, there is a case where the deformation becomes asymmetric by, for example, application of distortion along the long side direction of the shear force detection opening part 111. Also in such a case, when the shear force detection piezoelectric bodies 210A and 210B are provided in two regions at both sides of the compliance part 143, the detection accuracy of the shear force can be improved. For example, when the distortion amount of the shear force detection membrane 141 on the −X direction side with respect to the compliance part 143 is small and the distortion amount of the shear force detection membrane 141 on the +X direction side is large, when only the shear force detection piezoelectric body 210A is provided, there is a case where the shear force is determined to be small. On the other hand, when the shear force detection piezoelectric bodies 210A and 210B are provided at both sides of the compliance part 143, even when the electric signal outputted from the shear force detection piezoelectric body 210A is small, a large electric signal is outputted from the shear force detection piezoelectric body 210B, and the shear force detection accuracy can be improved.

Further, the shear force detection device 200 includes the arithmetic circuit 220 to add the signals outputted from the respective shear force detection piezoelectric bodies 210A and 210B by connecting the shear force detection upper electrode 213 of the shear force detection piezoelectric body 210A and the shear force detection lower electrode 212 of the shear force detection piezoelectric body 210B and by connecting the shear force detection lower electrode 212 of the shear force detection piezoelectric body 210A and the shear force detection upper electrode 213 of the shear force detection piezoelectric body 210B. A larger shear force detection signal can be obtained by the arithmetic circuit 220, and the shear force detection accuracy can be further improved.

Second Embodiment

Next, a shear force detection device 200A of a second embodiment will be described with reference to the drawings.

Figure 7A:
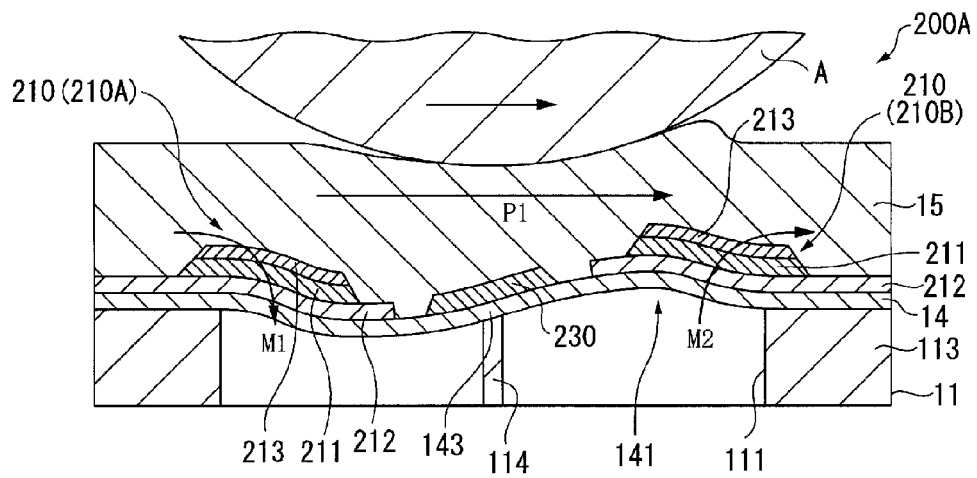
Figure 7B:
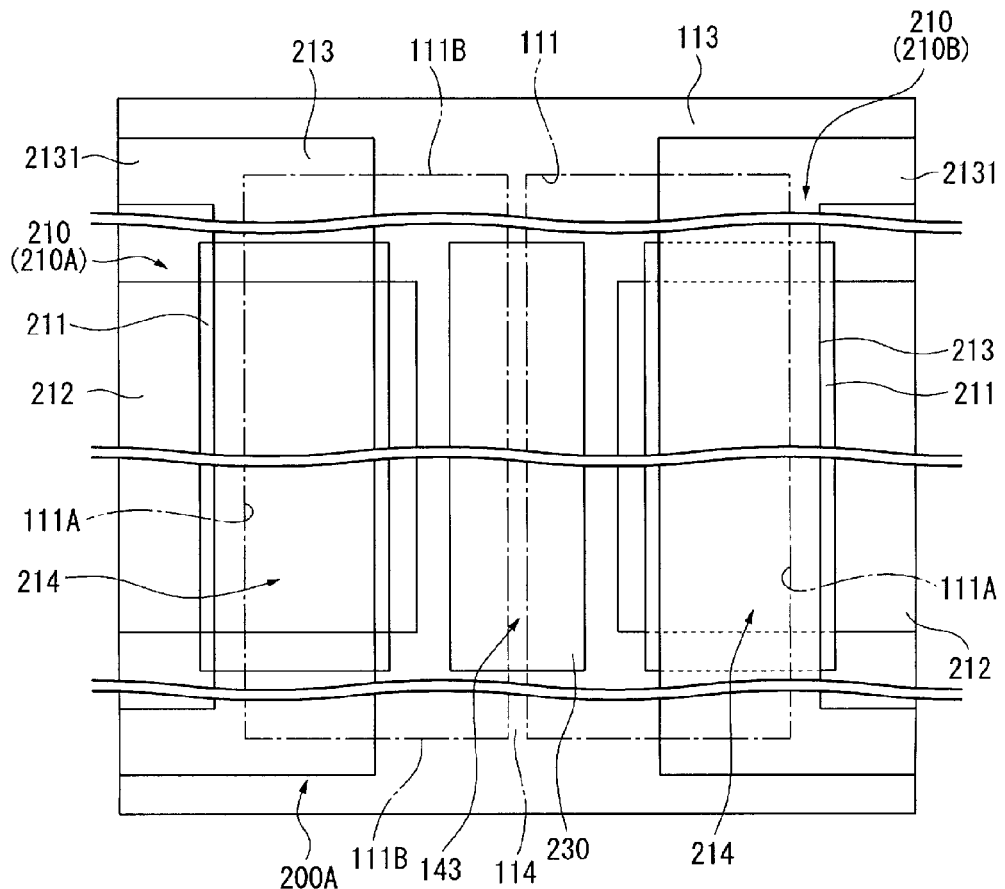

FIGS. 7A and 7B are views showing the shear force detection device 200A of the second embodiment, in which FIG. 7A is a sectional view showing the shear force detection device cut along a short side direction of a shear force detection opening part 111, and FIG. 7B is a plan view of the shear force detection device 200A. Incidentally, in the following description of the embodiment, the same component as the first embodiment is denoted by the same reference numeral and its description is omitted or simplified.

The second embodiment is such that a part of the structure of the shear force detection device 200 of the first embodiment is modified.

That is, similarly to the first embodiment, the shear force detection device 200A of the second embodiment is constructed such that a support film 14, a shear force detection piezoelectric body 210 (210A, 210B) and an elastic film 15 are laminated on a sensor substrate 11.

Here, in the shear force detection opening part 111 formed in the sensor substrate 11 of the shear force detection device 200A of the second embodiment, a support reinforcing part 114 parallel to a long side 111A is formed at a center position in a short side direction (X direction).

In addition to the shear force detection piezoelectric bodies 210A and 210B, a reinforcing film 230 is formed on the support film 14 between the shear force detection piezoelectric bodies 210A and 210B and at a position of overlapping with the support reinforcing part 114 when viewed in a sensor plane as shown in FIG. 7B. The reinforcing film 230 has only to suppress the change of a compliance part 143, and may be formed by, for example, laminating a lower electrode, a piezoelectric film, and an upper electrode at the time of formation of the shear force detection piezoelectric body 210. The reinforcing film 230 may be formed by, for example, laminating only a piezoelectric film, or may be another film member.

In the shear force detection device 200A of the second embodiment as described above, the support film 14 formed on the support reinforcing part 114 functions as the compliance part according to the invention.

That is, when a shear force is applied to a shear force detection membrane 141, the position where the support reinforcing part 114 is formed becomes a constant position, and distortion having a sine waveform shape is formed on the −X direction side and the +X direction side with respect to the support film 14 on the support reinforcing part 114.

Although the reinforcing film 230 may not be provided, in this case, the distortion amount of the shear force detection membrane 141 becomes large in the vicinity of the support reinforcing part 114, and there is a case where the distortion having the normal sine waveform is not formed. On the other hand, when the reinforcing film 230 is provided, the distortion amount of the shear force detection membrane 141 in the vicinity of the support reinforcing part 114 can be suppressed, and distortion shapes on the −X direction side and the +X direction side with respect to the support reinforcing part 114 can be made substantially the same.

In the shear force detection device 200A as described above, an electric signal outputted from the shear force detection piezoelectric body 210A and an electric signal outputted from the shear force detection piezoelectric body 210B have substantially the same absolute value although the signs are different, and a highly reliable shear force can be detected.

Third Embodiment

Next, a shear force detection device of a third embodiment of the invention will be described with reference to the drawings.

Figure 8A:
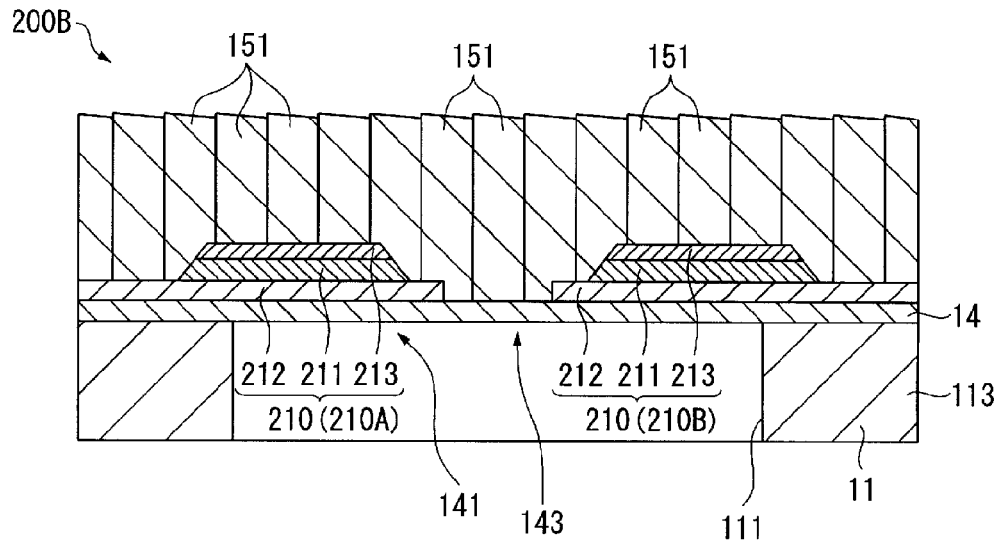
Figure 8B:
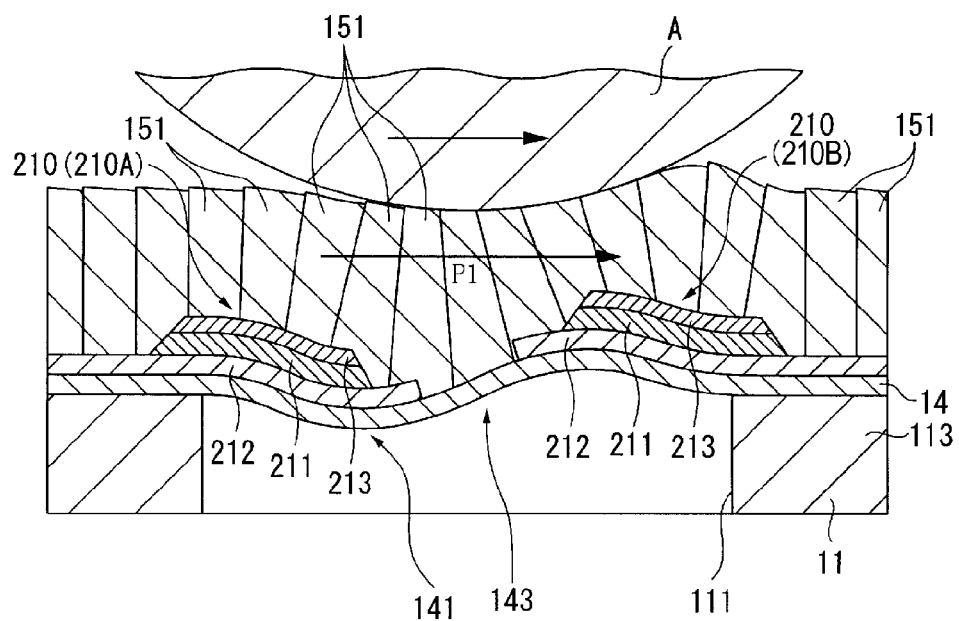

FIGS. 8A and 8B are sectional views showing the shear force detection device 200B of the third embodiment cut along a short side direction of a shear force detection opening part 111, in which FIG. 8A is a view showing a state where a shear force is not applied, and FIG. 8B is a view showing a state where a shear force is applied.

Since the third embodiment is such that the elastic film 15 of the shear force detection device 200 of the first embodiment is modified, the description of the structure of a sensor substrate 11, a support film 14 and a shear force detection piezoelectric body 210 will be omitted.

In the shear force detection device 200B of the third embodiment, a plurality of elastic members 151 are formed on the support film 14 or the upper layer of the shear force detection piezoelectric body 210.

Each of the elastic members 151 is a plate-like member, and in a state where a shear force is not applied, as shown in FIG. 8A, the elastic member is erected on the support film 14 and the shear force detection piezoelectric body 210 so that the plate surface direction is perpendicular to the surface direction of the support film 14 and the short side direction (shear force detection direction) of the shear force detection opening part 111. The plurality of elastic members 151 are laid in parallel to each other and along the shear force detection direction, so that the elastic layer according to the invention is formed.

Incidentally, although the elastic members 151 may be formed into rod shapes and may be erected in the direction perpendicular to the support film 14, in this case, the shear force in the Y direction is also transmitted to the support film 14, and this case is inappropriate when only the shear force in the X direction is detected. On the other hand, when the plurality of plate-like elastic members 151 are arranged in the X direction as in this embodiment, only the shear force in the X direction can be excellently transmitted to the support film 14.

The elastic member 151 as stated above is formed to have rigidity higher than that of the support film 14, and the rigidity in the plate surface direction is formed to be higher than the rigidity in the plate thickness direction. Thus, when an object A contacts with a grasping surface 5, and a shear force is applied, as shown in FIG. 8B, a moment force acts on the respective elastic members 151, and the support film 14 and the shear force detection piezoelectric body 210 are deformed by this.

In the shear force detection device 200B of the third embodiment as described above, similarly to the first embodiment, the shear force can be detected by the simple structure. In addition to this, in the shear force detection device 200B, the respective elastic members 151 are rotated by the moment force, and the support film 14 is deformed by the rotation of these elastic members 151. Thus, the distortion amount of the support film 14 can be increased in response to the shear force received from the object A, and a larger shear force detection signal can be outputted from the shear force detection device 200B. Accordingly, the detection accuracy of the shear force can be further improved.

Fourth Embodiment

Next, as an applied example of the shear force detection device as described above, a tactile sensor including the shear force detection device 200 of the first embodiment will be described with reference to the drawings.

Structure of the Tactile Sensor

Figure 9:
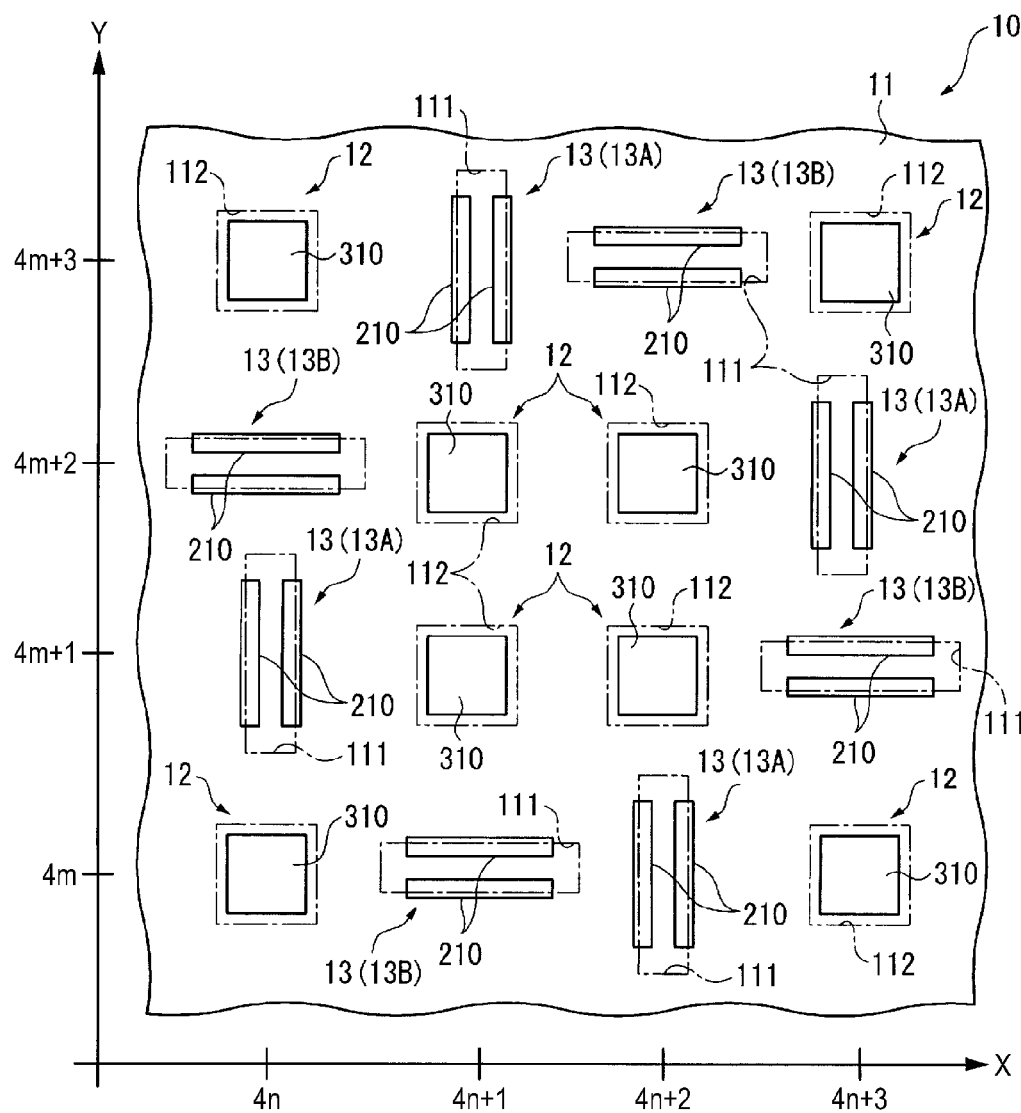
FIG. 9 is a plan view in which a part of a tactile sensor of a fourth embodiment is enlarged.

FIG. 9 is a plan view in which a part of a tactile sensor of a fourth embodiment is enlarged.

As shown in FIG. 9, the tactile sensor 10 includes plural positive pressure detecting parts 12, and plural first shear force detecting parts 13A and plural second shear force detecting parts 13B in each of which the shear force detection device 200 of the first embodiment is arranged.

Each of the positive pressure detecting parts 12 is a sensor device formed into, for example, a square shape, and detects a pressure perpendicular to a sensor plane of the tactile sensor 10.

Similarly to the first embodiment, the first shear force detecting part 13A is the shear force detection device 200 long in the Y direction and detects a shear force generated in the X direction.

The second shear force detecting part 13B is such that the arrangement direction of the foregoing shear force detection device 200 is changed, and is the shear force detection device 200 which is long in the X direction and detects a shear force generated in the Y direction.

These detecting parts 12, 13A and 13B are arranged in a two-dimensional array structure on a sensor substrate 11 constituting a support body according to the invention.

Specifically, as shown in FIG. 9, in a specified rectangular range in the surface of the sensor substrate 11, the positive detecting parts 12 are arranged at positions corresponding to corners of the rectangular range and on diagonal lines of the rectangle. The first shear force detecting part 13A long along a specified one direction and the second shear force detecting part 13B long in a direction perpendicular to the longitudinal direction of the first shear force detecting part 13A are arranged at positions adjacent to each of the positive pressure detecting parts 12. That is, when the coordinate axes of the X direction and the Y direction are set in the plane of the sensor substrate 11, the positive pressure detecting parts 12 are arranged at positions of (X, Y)=(4n, 4m), (4n, 4m+3), (4n+1, 4m+1), (4n+1, 4m+2), (4n+2, 4 m+1), (4n+2, 4m+2), (4n+3, 4m) and (4n+3, 4m+3), where n and m are natural numbers. The first shear force detecting parts 13A are arranged at positions of (X, Y)=(4n, 4m+1), (4n+1, 4m+3), (4n+2, 4m) and (4n+3, 4 m+2), and the second shear force detecting parts 13B are arranged at positions of (X, Y)=(4n, 4m+2), (4n+1, 4m), (4n+2, 4 m+3) and (4n+3, 4 m+1). As stated above, since the positive pressure detecting parts 12, the first shear force detecting parts 13A and the second shear force detecting parts 13B are uniformly provided in the plane of the sensor substrate 11, even when the object A contacts with any position on the sensor substrate 11, the positive pressure and the shear force can be detected.

Figure 10:
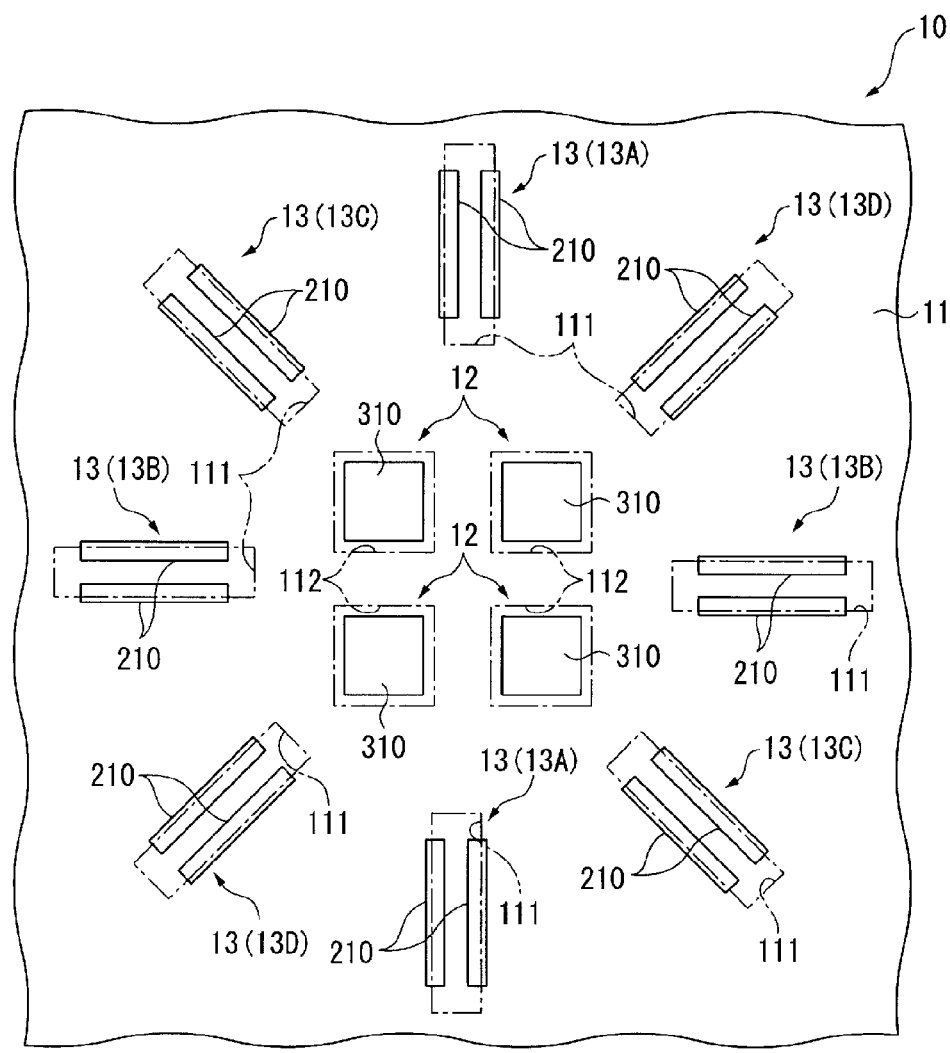
FIG. 10 is a plan view showing a modified example of a tactile sensor.

Incidentally, the arrangement structure of the positive pressure detecting parts 12, the first shear force detecting parts 13A and the second shear force detecting parts 13B is not limited to the pattern of FIG. 9, and for example, another array structure as shown in FIG. 10 may be formed.

FIG. 10 is a view showing another arrangement example of the positive pressure detecting parts 12 and the shear force detecting parts 13 in the tactile sensor.

That is, in the tactile sensor 10 shown in FIG. 10, the positive pressure detecting parts 12 are arranged at specified positions on a sensor substrate 11, and the shear force detecting parts 13 are arranged radially on the outer periphery of the positive detecting parts 12 and at intervals of, for example, 45 degrees. In this case, a third shear force detecting part 13C to detect a shear force in a direction of inclination of +1 and a fourth shear force detecting part 13D to detect a shear force in a direction of inclination of −1 are provided in addition to a first shear force detecting part 13A to detect a shear force in the X direction, and a second shear force detecting part 13B to detect a shear force in the Y direction.

Structure of the Positive Pressure Detecting Part

Figure 11A:
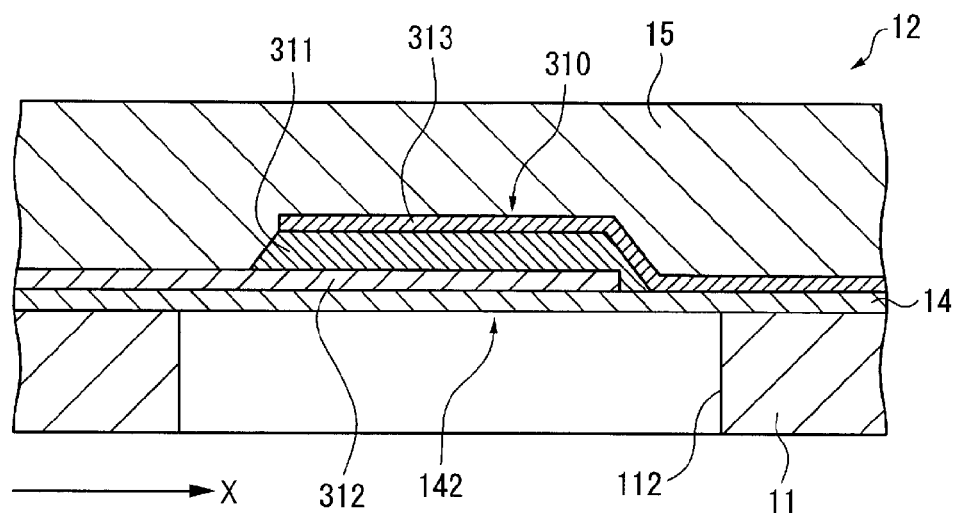
Figure 11B:
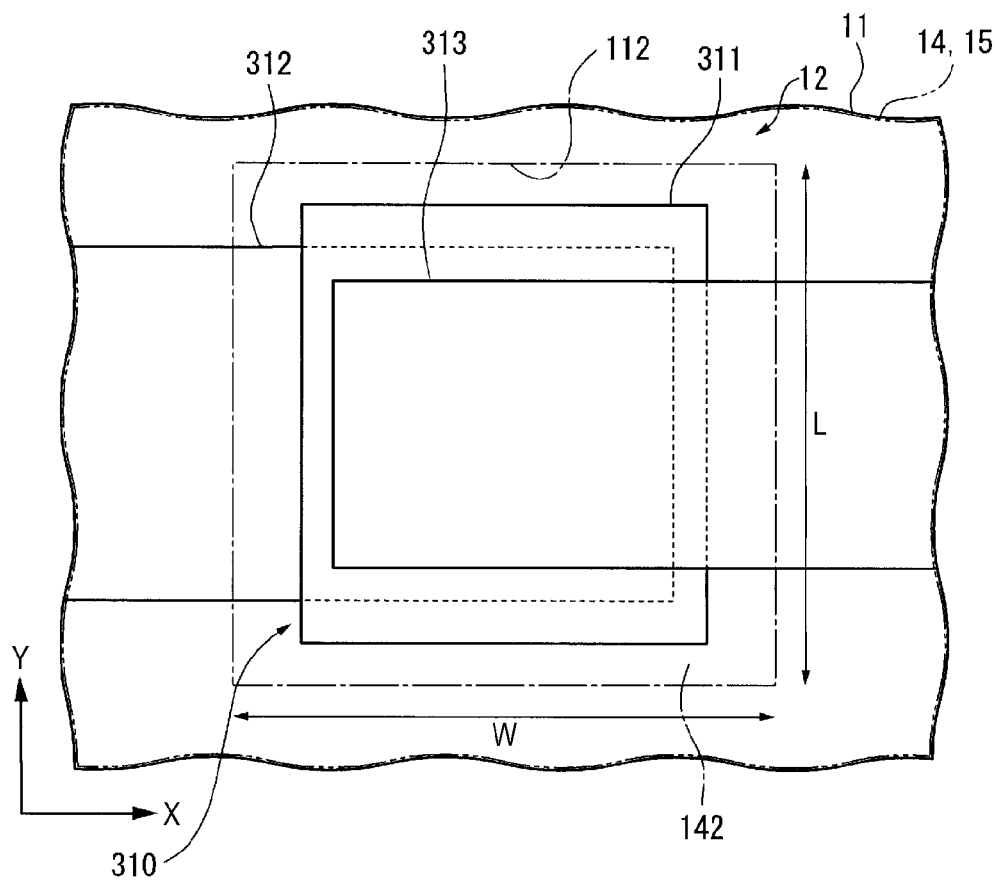

Next, a structure of the positive pressure detecting part 12 constituting the tactile sensor 10 will be described with reference to the drawings. FIGS. 11A and 11B are views showing a schematic structure of the positive pressure detecting part 12, in which FIG. 11A is a sectional view of the positive pressure detecting part 12 cut along a substrate thickness direction of the sensor substrate 11, and FIG. 11B is a plan view of the positive pressure detecting part 12 when viewed in a sensor plane.

As shown in FIGS. 11A and 11B, the positive pressure detecting part 12 is constructed by laminating a support film 14, a positive pressure detection piezoelectric body 310 constituting the positive pressure detection piezoelectric body according to the invention, and an elastic film 15 constituting the elastic layer according to the invention on the sensor substrate 11.

Here, the sensor substrate 11, the support film 14 and the elastic film 15 constituting the positive pressure detecting part 12 are the same as the sensor substrate 11, the support film 14 and the elastic film 15 constituting the shear force detection device 200 constituting the shear force detecting part 13A, 13B. That is, the shear force detection opening part 111 constituting the shear force detection device 200 and a square positive pressure detection opening part 112 as a positive pressure detection opening part are formed in the one sensor substrate 11. The support film 14 and the elastic film 15 are formed on the entire surface of the sensor substrate 11 so as to cover the sensor substrate 11. Accordingly, the detailed description of the sensor substrate 11, the support film 14 and the elastic film 15 will be omitted here.

In the following description, when viewed in a sensor plane as shown in FIG. 11B, the support film 14 overlapping with the inner peripheral region of the positive pressure detection opening part 112 is called a positive pressure detection membrane 142.

The positive pressure detection piezoelectric body 310 includes a positive pressure detection piezoelectric film 311, a positive pressure detection lower electrode 312 arranged between the positive pressure detection piezoelectric film 311 and the support film 14, and a positive pressure detection upper electrode 313 arranged between the positive pressure detection piezoelectric film 311 and the elastic film 15. The positive pressure detection piezoelectric film 311, the positive pressure detection lower electrode 312, and the positive pressure detection upper electrode 313 can be formed of the same material as the shear force detection piezoelectric film 211, the shear force detection lower electrode 212 and the shear force detection upper electrode 213 of the shear force detection device 200.

The positive pressure detection lower electrode 312 is a film-like electrode formed to have a thickness of, for example, 200 nm. The positive pressure detection lower electrode 312 is formed to extend from the center of the square positive pressure detection opening part 112 to a specified one side (in this embodiment, the −X direction). The positive pressure detection upper electrode 313 is a film-like electrode formed to have a thickness of, for example, 50 nm. The positive pressure detection upper electrode 313 is formed to extend in the opposite direction (in FIGS. 11A and 11B, the right direction of the paper surface) to the direction in which the positive pressure detection lower electrode 312 extends.

The positive pressure detection upper electrode 313 and the positive pressure detection lower electrode 312 are respectively connected to a not-shown pattern electrode formed on the support film 14, and are connected to, for example, a control device to process a signal from a tactile sensor 10 through a conduction member such as, for example, a flexible substrate.

Operation of the Positive Pressure Detecting Part

In the positive pressure detecting part 12 as described above, a voltage is previously applied between the positive pressure detection upper electrode 313 and the positive pressure detection lower electrode 312 to cause polarization. In this state, when a pressure (positive pressure) in the substrate thickness direction is applied to the tactile sensor 10, the positive pressure detection membrane 142 is distorted to the positive pressure detection opening part 112 side by the positive pressure. As such, the positive pressure detection piezoelectric body 310 formed on the positive pressure detection membrane 142 is also distorted, and a potential difference is generated in the positive pressure detection piezoelectric film 311. Accordingly, a current based on the potential difference flows to the positive pressure detection upper electrode 313 and the positive pressure detection lower electrode 312, and is outputted as a positive pressure detection signal from the tactile sensor 10.

Operation and Effect of the Fourth Embodiment

In the tactile sensor 10 of the fourth embodiment as described above, the shear force detection device 200 of the first embodiment is arranged. As described before, in the shear force detection device 200, the respective layers can be easily formed by lamination using sputtering or the like or patterning using etching or the like. Accordingly, also in the tactile sensor 10 in which the shear force detection devices 200 are arranged in the array structure as shown in FIG. 9 or FIG. 10, the same operation and effect as those of the shear force detection device 200 are obtained, the reduction in thickness and size can be realized by the simple structure, and the manufacturing efficiency can be improved.

In addition to this, in the tactile sensor 10, the one sensor substrate 11 is used as the support body according to the invention and the positive pressure detection support body. The support film 14 and the elastic film 15 are formed on the entire surface of the sensor substrate 11, and the positive pressure detecting part 12 and the shear force detecting parts 13A and 13B are constructed. Thus, as compared with a structure in which the positive pressure detecting part 12, and the shear force detecting parts 13A and 13B are manufactured one by one and are arranged on the substrate, the tactile sensor 10 including the respective detecting parts 12, 13A and 13B arranged on the sensor substrate 11 in the array structure can be manufactured at one time, and the manufacturing efficiency and the cost can be improved.

In the tactile sensor 10 as described above, the plural first shear force detecting parts 13A and the plural second shear force detecting parts 13B in which the arrangement directions of the shear force detection devices 200 are varied are provided.

The tactile sensor 10 as described above can detect the shear force in both the X direction and the Y direction. That is, the shear force in all directions acting along the sensor surface of the tactile sensor 10 can be detected.

The tactile sensor 10 includes the positive pressure detecting part 12. Accordingly, not only the shear force acting on the sensor surface of the tactile sensor 10, but also the pressure perpendicular to the sensor surface can be detected, and the force acting in each direction when the object A contacts with the tactile sensor 10 can be suitably detected.

Fifth Embodiment

Next, as an applied example of the tactile sensor 10 of the fourth embodiment, a grasping apparatus including the tactile sensor 10 will be described with reference to the drawings.

Figure 12:
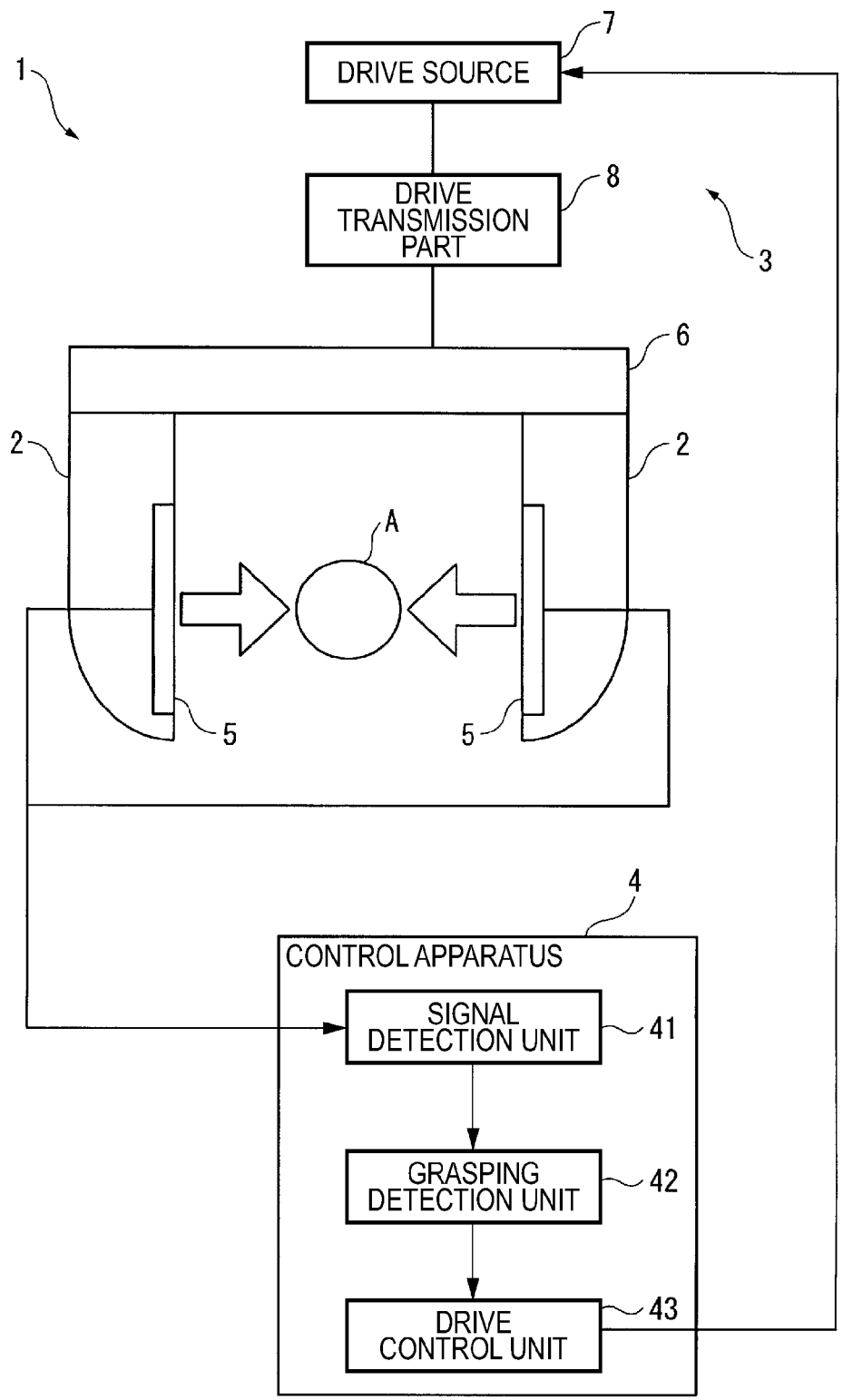
FIG. 12 is an apparatus block diagram showing a schematic structure of a grasping apparatus of a fifth embodiment.

FIG. 12 is an apparatus block diagram showing a schematic structure of the grasping apparatus of the fifth embodiment of the invention.

In FIG. 12, the grasping apparatus 1 includes at least a pair of grasping arms 2, and grasps an object A by the grasping arms 2. The grasping apparatus 1 is, for example, an apparatus to grasp and lift an object conveyed by a belt conveyor or the like in such as a manufacturing factory for manufacturing products. The grasping apparatus 1 includes the grasping arms 2, an arm drive part 3 to drive the grasping arms 2, and a control device 4 to control driving of the arm drive part 3.

The pair of grasping arms 2 have grasping surfaces as contact surfaces at respective tip parts, and bring the grasping surfaces 5 into contact with the object A to grasp and lift the object A. Here, in this embodiment, although the structure is exemplified in which the pair of grasping arms 2 are provided, no limitation is made to this. For example, the object A may be grasped at three points by three grasping arms 2.

The tactile sensor 10 described in the fourth embodiment is provided on the surface of the grasping surface 5 provided on the grasping arm 2, and the elastic film 15 (see FIG. 1, FIGS. 11A and 11B) of the surface part of the tactile sensor 10 is formed to be exposed. The grasping arm 2 grasps the object A by causing the elastic film 15 to contact with the object A and by applying a specified pressure (positive pressure) to the object A. In the grasping arm 2 as stated above, the tactile sensor 10 provided on the grasping surface 5 detects the positive pressure applied to the object A and the shear force caused by the object A which is urged to be slid down from the grasping surface 5 when the object is grasped, and outputs an electric signal corresponding to the positive pressure and the shear force to the control device 4.

The arm drive part 3 is a device to move the pair of grasping arms 2 in a direction of approaching and separating each other. The arm drive part 3 includes a hold member 6 to movably hold the grasping arm 2, a drive source 7 to generate a driving force to move the grasping arm 2, and a drive transmission part 8 to transmit the driving force of the drive source to the grasping arm 2.

The hold member 6 includes, for example, a guide groove along the movement direction of the grasping arm 2, and holds the grasping arm 2 through the guide groove so that the grasping arm is movably held. The hold member 6 is provided to be movable in the vertical direction.

The drive source 7 is, for example, a drive motor, and generates the driving force according to a drive control signal inputted from the control device 4.

The drive transmission part 8 includes, for example, plural gears, transmits the driving force generated in the drive source 7 to the grasping arm 2 and the hold member 6, and moves the grasping arm 2 and the hold member 6.

Incidentally, in this embodiment, although the above structure is described as an example, no limitation is made to this. That is, no limitation is made to the structure in which the grasping arm 2 is moved along the guide groove of the hold member 6, and the structure may be such that the grasping arm is rotatably held. As the drive source 7, no limitation is made to the drive motor, and for example, a hydraulic pump may be used to drive. The drive transmission part 8 is not limited to, for example, a structure in which the driving force is transmitted by gears, and a structure in which driving force is transmitted by a belt or a chain, or a structure including a piston driven by hydraulic pressure or the like may be adopted.

The control device 4 is connected to the tactile sensor 10 provided on the grasping surface 5 of the grasping arm 2 and the arm drive part 3, and controls the entire operation of grasping the object A in the grasping apparatus 1.

Specifically, as shown in FIG. 12, the control device 4 is connected to the arm drive part 3 and the tactile sensor 10, and controls the entire operation of the grasping apparatus 1. The control device 4 includes a signal detection unit 41 that reads a shear force detection signal and a positive pressure detection signal inputted from the tactile sensor 10, a grasping detection unit 42 that detects a slide state of the object A, and a drive control unit 43 that outputs a drive control signal for controlling the driving of the grasping arm 2 to the arm drive part 3. As the control device 4, for example, a general purpose computer such as a personal computer can be used, and the structure may include an input device such as a keyboard, a display part to display the grasping state of the object A, and the like.

The signal detection unit 41, the grasping detection unit 42 and the drive control unit 43 may be stored as programs in a storage section such as a memory, and may be suitably read and executed by an arithmetic circuit such as a CPU, or may be constructed of, for example, an integrated circuit which performs specified processing on an inputted electric signal.

The signal detection unit 41 is connected to the tactile sensor 10, and recognizes the positive pressure detection signal and the shear force detection signal and the like inputted from the tactile sensor 10. The detection signal recognized by the signal detection unit 41 is outputted to and stored in a storage section such as a not-shown memory and is outputted to the grasping detection unit 42.

The grasping detection unit 42 determines, based on the shear force detection signal, whether the grasping arm 2 grasps the object A.

Figure 13:
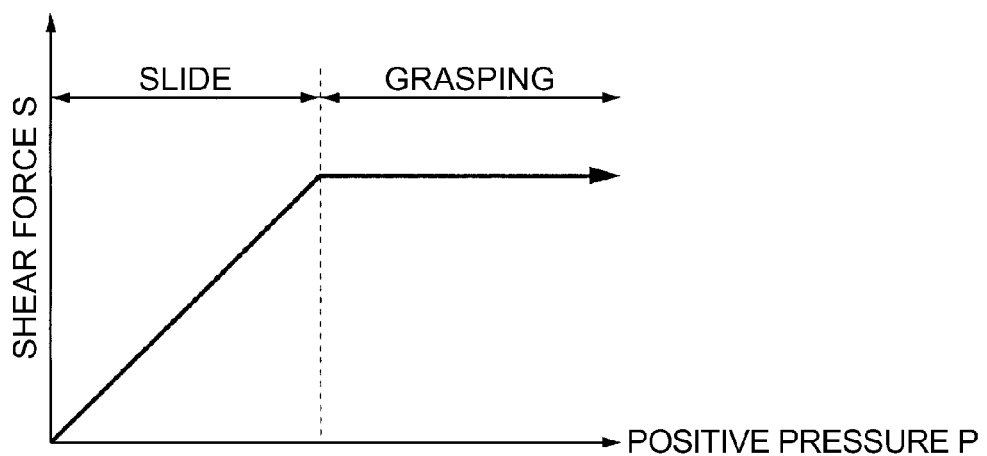
FIG. 13 is a view showing a relation between a positive pressure and a shear force acting on a tactile sensor in a grasping operation of the grasping apparatus.

Here, FIG. 13 shows a relation between the positive pressure and the shear force acting on the tactile sensor in the grasping operation of the grasping apparatus 1.

In FIG. 13, until the positive pressure reaches a specified value, the shear force increases according to the increase of the positive pressure. This state is a state where a dynamic friction force acts between the object A and the grasping surface 5. The grasping detection unit 42 determines that the state is such that the object A is sliding down from the grasping surface 5 and the grasping is not completed. On the other hand, when the positive pressure becomes the specified value or more, the state becomes such that even if the positive pressure is increased, the shear force is not increased. This state is the state where a static friction force acts between the object A and the grasping surface 5, and the grasping detection unit 42 determines that the state is a grasping state where the object A is grasped by the grasping surface 5.

Specifically, when the value of the shear force detection signal exceeds a specified threshold corresponding to the static friction force, it is determined that the grasping is completed.

The drive control unit 43 controls the operation of the arm drive part 3 based on the electric signal detected by the grasping detection unit 42.

Next, the operation of the control device 4 will be described with reference to the drawings.

Figure 14:
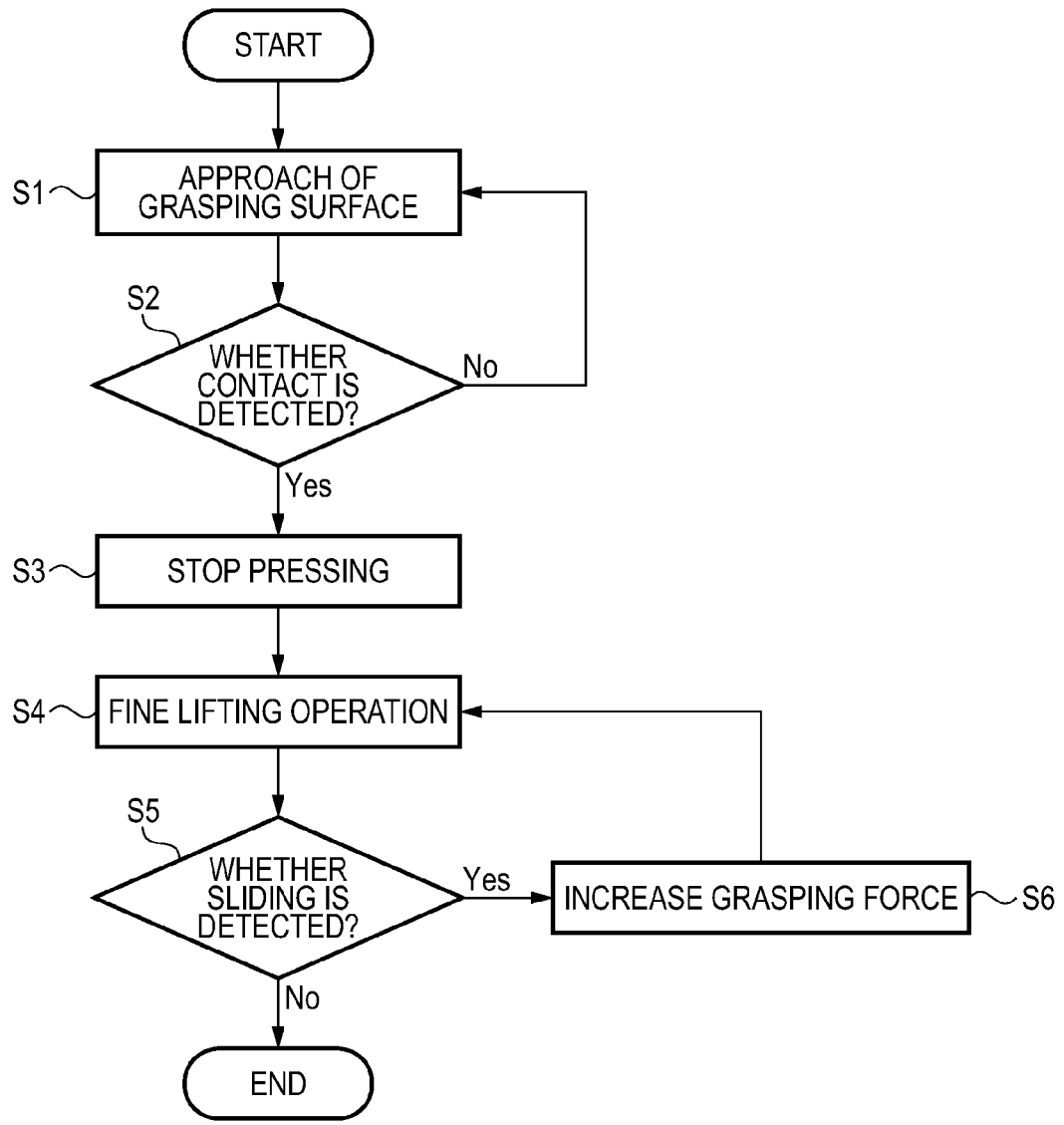
FIG. 14 is a flowchart showing the grasping operation of the grasping apparatus by control of a control device.
Figure 15:
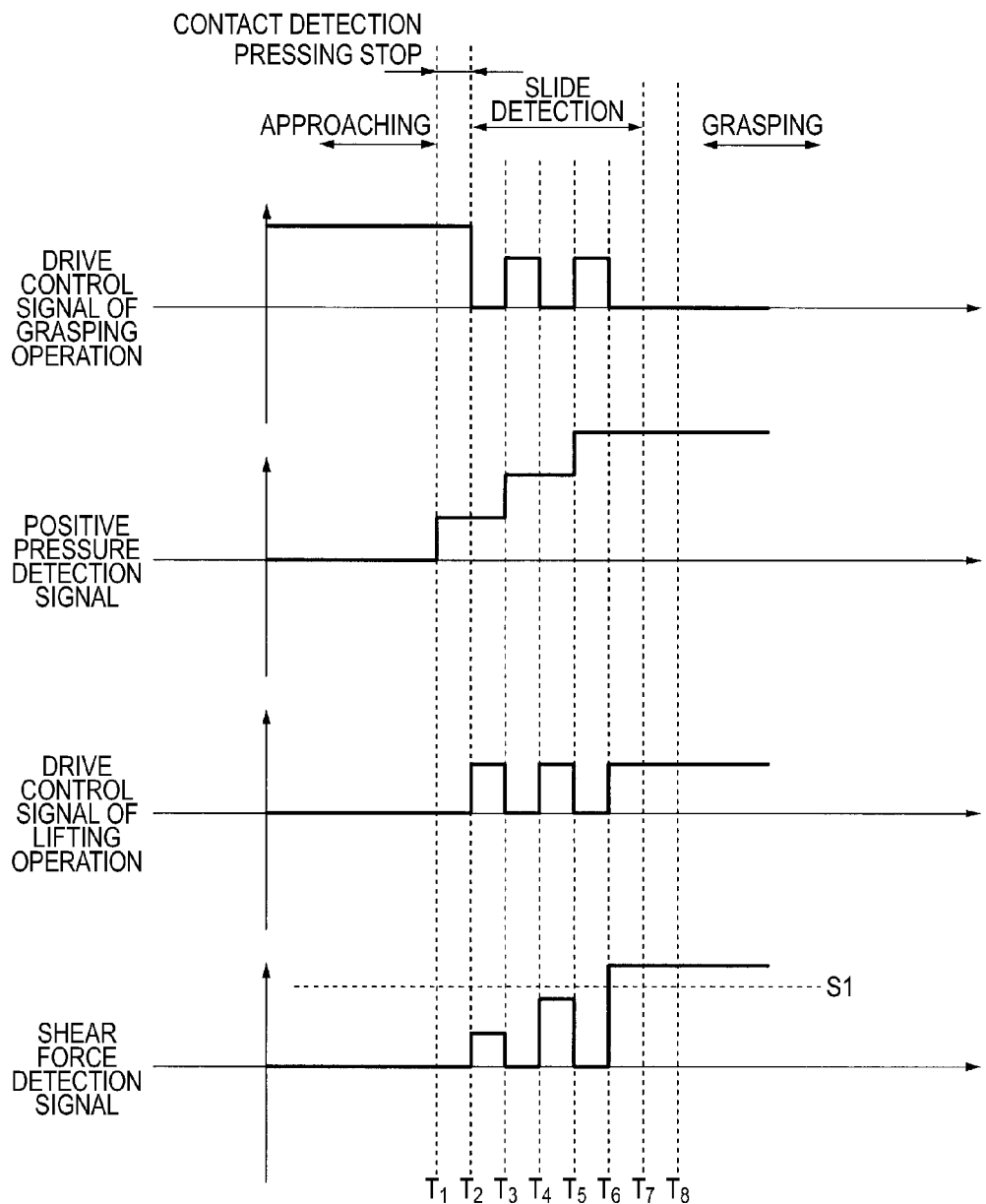
FIG. 15 is a timing chart showing signal timings of a drive control signal to an arm drive part and a detection signal outputted from a tactile sensor at the time of the grasping operation of the grasping apparatus.

FIG. 14 is a flowchart showing the grasping operation of the grasping apparatus 1 by the control of the control device 4. FIG. 15 is a timing chart showing signal timings of a drive control signal to the arm drive part 3 and a detection signal outputted from the tactile sensor 10.

In order to grasp the object A by the grasping apparatus 1, first, the drive control unit 43 of the control device 4 outputs a drive control signal to move the respective grasping arms 2 in the direction of approaching each other to the arm drive part 3 (grasping operation). As such, the grasping surfaces 5 of the grasping arms 2 approach the object A (FIG. 14: step S1).

Next, the grasping detection unit 42 of the control device 4 determines whether the object A contacts with the grasping surface 5 (FIG. 14: step S2). Specifically, the control device 4 determines whether the signal detection unit 41 detects the input of the positive pressure detection signal. Here, when the positive detection signal is not detected, it is determined that the grasping surface 5 does not contact with the object A, and the drive control unit 43 continues step S1 to output the drive control signal, and drives the grasping arm 2.

On the other hand, when the grasping surface 5 contacts with the object A (FIG. 15: timing T1), the positive pressure detection membrane 142 of the positive pressure detecting part 12 of the tactile sensor 10 is distorted, and the positive pressure detection signal corresponding to the distortion amount is outputted.

When the grasping detection unit 42 detects the positive pressure detection signal, the drive control unit 43 stops the approaching movement of the grasping arms 2 (pressing to the object A) (FIG. 14: step S3, FIG. 15: timing T2). The drive control unit 43 outputs the drive control signal to the arm drive part 3, and causes the operation of lifting the grasping arm 2 to be performed (lifting operation) (FIG. 14: step S4, FIG. 15: timing T2 to T3).

Here, when the object A is lifted, the elastic film 15 is distorted by the shear force, and the distortion occurs also in the shear force detection membrane 141 of the shear force detection device 200 constituting the shear force detecting parts 13A, 13B. Accordingly, the shear force detection signal corresponding to the distortion of the shear force detection membrane 141 is outputted from the shear force detecting parts 13A, 13B.

The grasping detection unit 42 determines, based on the shear force detection signal inputted to the signal detection unit 41, whether sliding is occurring (step S5).

At this time, when the grasping detection 42 determines that sliding is occurring, the drive control unit 43 controls the arm drive part 3, moves the grasping arm 2 in the direction in which the grasping surface 5 is pressed to the object A, and increases the grasping force (positive pressure) (FIG. 14: step S6).

That is, at timing T3 of FIG. 15, the control device 4 causes the drive control unit 43 to perform the grasping operation, and increases the positive pressure to the object A. The signal detection unit 41 again detects the shear force detection signal outputted from the shear force detecting parts 13A, 13B. The foregoing slide detection operation (timing T2 to T6) is repeated, and when the shear force detection signal becomes the specified threshold S1 or more (timing T6), it is determined at step S5 that there is no sliding, that is, the grasping is completed, and the slide detection operation is stopped.

Operation and Effect of the Fifth Embodiment

The grasping apparatus 1 of the fifth embodiment as described above includes the tactile sensor 10 of the fourth embodiment. As described above the tactile sensor 10 can be reduced in thickness and size by the simple structure, and the manufacturing efficiency can also be improved. Thus, also in the grasping apparatus 1, the same operation and effect can be obtained.

The tactile sensor 10 is provided on the grasping surface 5 of the grasping apparatus 1 as described above. Accordingly, the positive pressure and the shear force when the object A is grasped can be detected by the tactile sensor 10 at high accuracy, and the grasping operation without damage and sliding of the object A can be performed at high accuracy based on the detected positive pressure and the shear force.

The tactile sensor 10 can detect the shear force in both the X direction and the Y direction. Accordingly, in the embodiment, although the shear force when the object A is lifted is measured, for example, when the object conveyed on a belt conveyor is grasped, the shear force in the conveyance direction can also be measured.

Other Embodiments

Incidentally, the invention is not limited to the foregoing embodiments and includes modifications and improvements within the scope where the object of the invention can be achieved.

For example, in the first to the third embodiments, although the shear force detection piezoelectric body 210 (210A, 210B) is provided on each of the pair of long sides 111A of the one rectangular shear force detection opening part 111, no limitation is made to this. For example, as shown in FIG. 16, the shear force detection piezoelectric body 210 may be provided for one of the pair of long sides 111A of the shear force detection opening part 111.

In this case, the size of the shear force detection device 200 in the short side direction can be formed to be smaller, and the shear force detection device 200 and the tactile sensor 10 can be further miniaturized.

Figure 16:
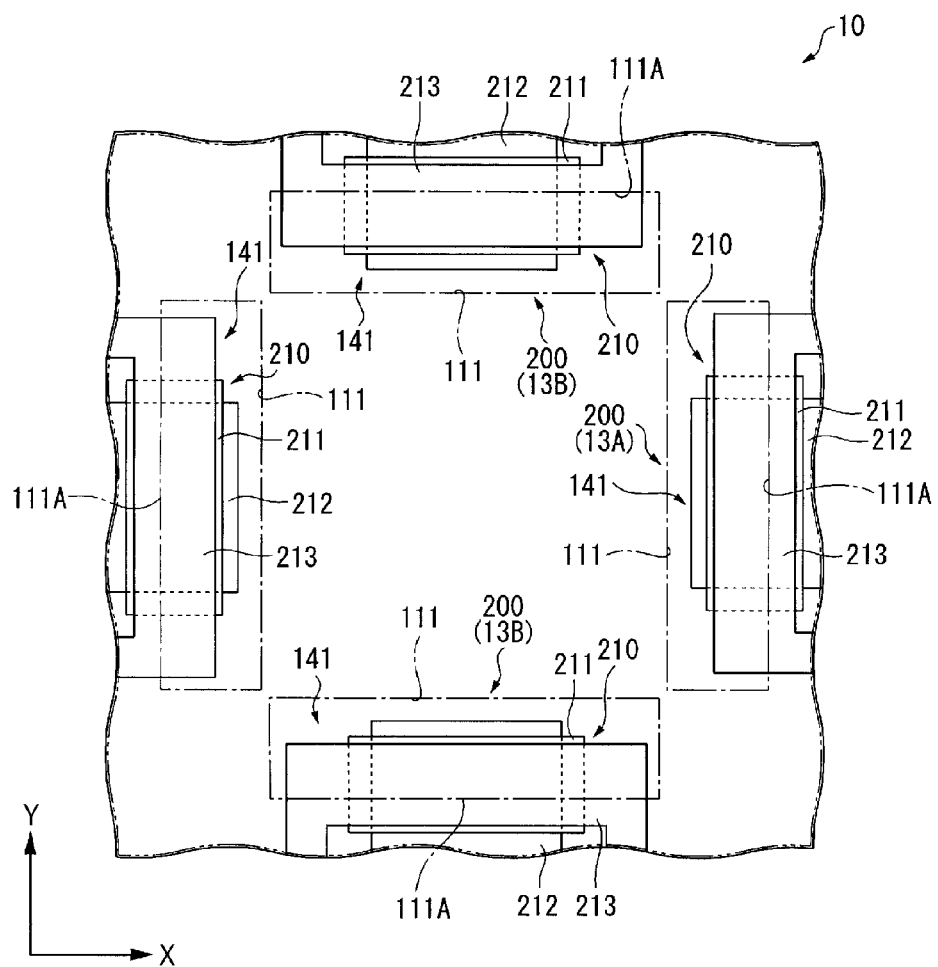
FIG. 16 is a plan view showing a part of a tactile sensor of another embodiment.
Figure 17A:
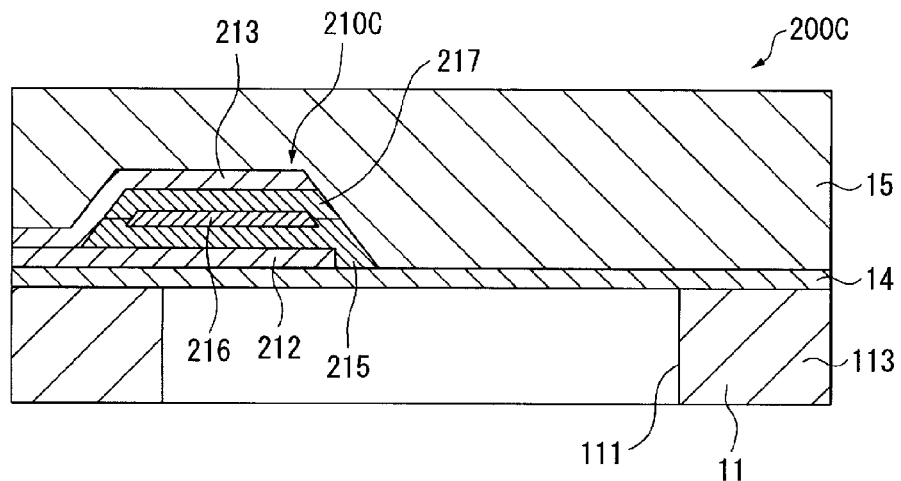
Figure 17B:
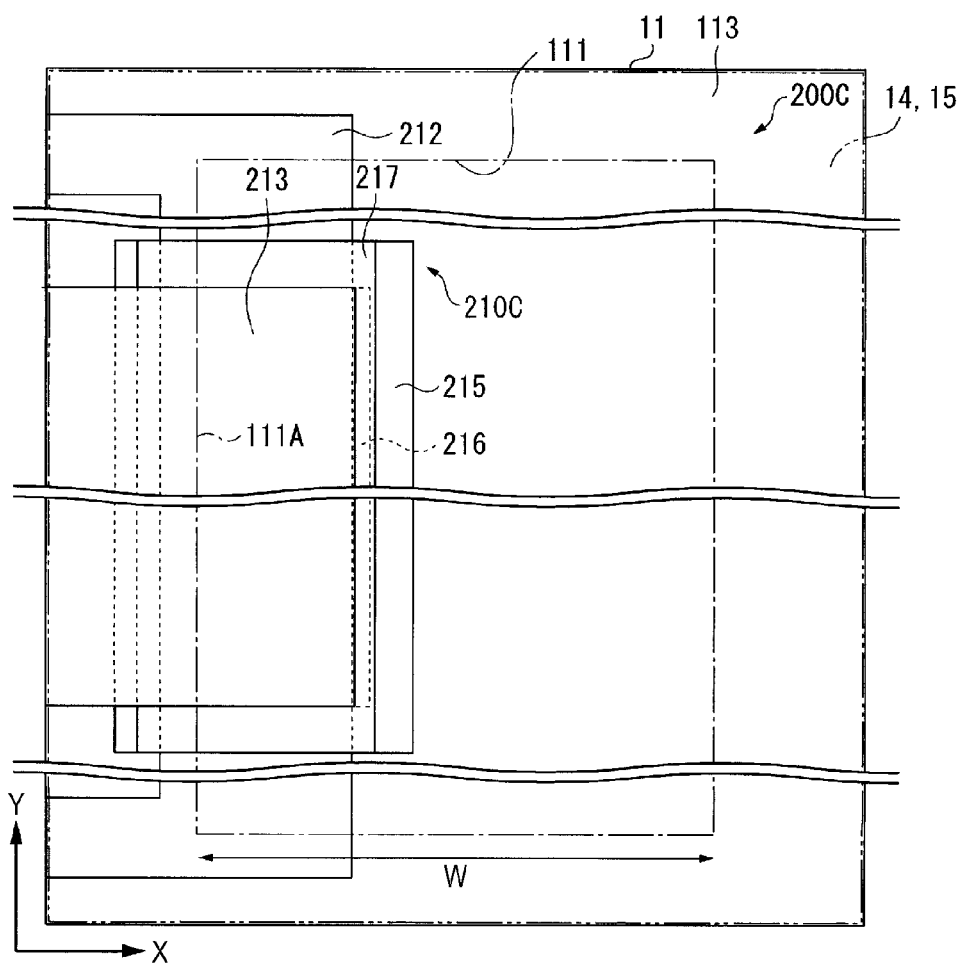

As shown in FIG. 16, in the structure in which the shear force detection piezoelectric body 210 is provided for one of the pair of long sides 111A of the shear force detection opening part 111, there is a concern that the shear force detection signal outputted from the one shear force detection device 200 becomes small. On the other hand, as shown in FIGS. 17A and 17B, a structure including a shear force detection device 200C provided with a so-called bimorph may be adopted in which two shear force detection piezoelectric films 211 are superimposed for one long side 111A. FIGS. 17A and 17B are views showing the shear force detection device 200C having the bimorph shear force detection piezoelectric body 210 according to another embodiment, in which FIG. 17A is a sectional view along the short side direction, and FIG. 17B is a plan view when viewed in a sensor plane.

Specifically, in the shear force detection device 200C, a shear force detection piezoelectric body 210C is formed along, for example, the long side 111A on the −X direction side in the pair of long sides 111A of the shear force detection opening part 111. The shear force detection piezoelectric body 210C can be easily formed by laminating a shear force detection lower electrode 212, a first layer piezoelectric film 215, an intermediate electrode 216, a second layer piezoelectric film 217, and a shear force detection upper electrode 213 in sequence on a support film 14. Since electric signals are outputted from the first layer piezoelectric film 215 and the second layer piezoelectric film 217 respectively, the sum of these electric signals is outputted as the shear force detection signal outputted from the shear force detection device 200C. Thus, a large signal value can be obtained. Accordingly, by providing the one shear force detection piezoelectric body 210C as shown in FIGS. 17A and 17B for the one shear force detection opening part 111 as shown in FIG. 16, the shear force detection device 200C and the tactile sensor can be miniaturized without reducing the shear force detection accuracy.

When the shear force detection device 200C as shown in FIGS. 17A and 17B is used, the arithmetic circuit 220 to connect the electrodes of the two shear force detection piezoelectric bodies 210A and 210B as shown in FIG. 5 is not required, and the circuit structure can be further simplified.

Figure 18A:
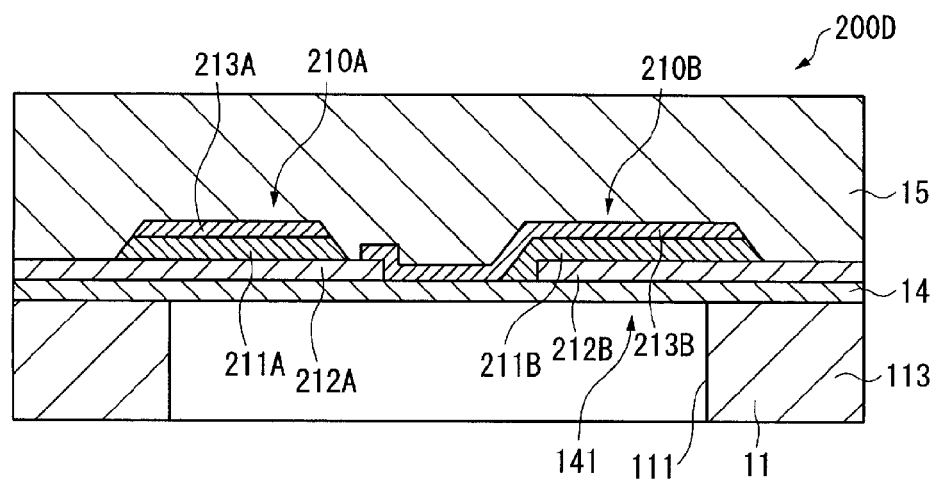
Figure 18B:
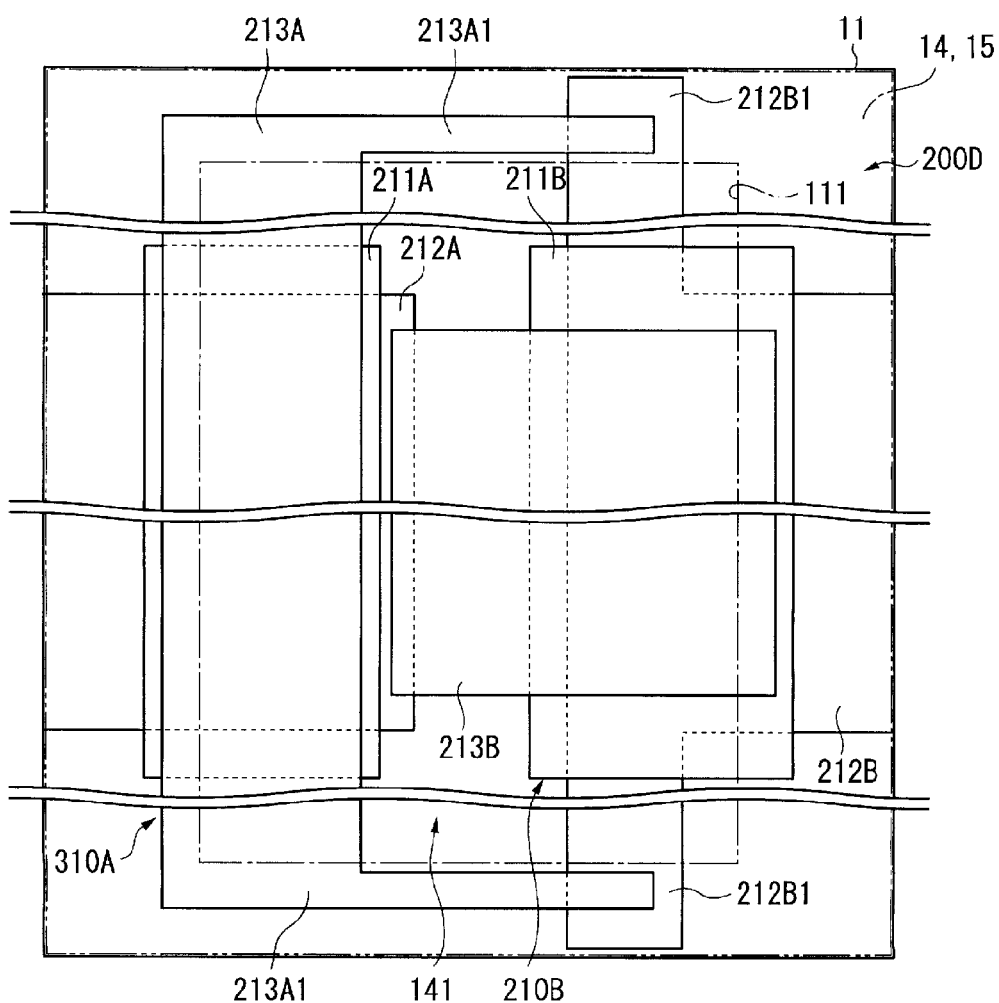

Further, in the first embodiment, although the shear force detection piezoelectric bodies 210A and 210B are constructed as individual bodies, and each of them includes the shear force detection upper electrode 213 and the shear force detection lower electrode 212, the structure as shown in, for example, FIGS. 18A and 18B may be adopted. FIGS. 18A and 18B are views showing the structure of a shear force detection device according to another embodiment, in which FIG. 18A is a sectional view cut along a short side direction (X direction), and FIG. 18B is a plan view when viewed in a sensor plane.

In a shear force detection device 200D shown in FIGS. 18A and 18B, a shear force detection piezoelectric body 210A and a shear force detection piezoelectric body 210B are respectively provided on a support film 14 along a pair of long sides 111A of a shear force detection opening part 111. The shear force detection piezoelectric body 210A arranged on the −X direction side includes a shear force detection lower electrode 212A, a shear force detection piezoelectric film 211A, and a shear force detection upper electrode 213A. The shear force detection piezoelectric body 210B arranged on the +X direction side includes a shear force detection lower electrode 212B, a shear force detection piezoelectric film 211B and a shear force detection upper electrode 213B.

Here, the shear force detection lower electrode 212A arranged on the −X direction side is formed to protrude from the shear force detection piezoelectric film 211A to the +X direction side. On the other hand, the −X direction side edge of the shear force detection lower electrode 212B arranged on the +X direction side is positioned on the +X direction side relative to the −X direction side edge of the shear force detection piezoelectric film 211B. That is, the −X direction side edge of the shear force detection lower electrode 212B is covered with the shear force detection piezoelectric film 211B. A first electrode connection part 212B1 extending to the outer region of a shear force detection membrane 141 in the ±Y directions is continuously formed at the −X direction side end of the shear force detection lower electrode 212B.

The shear force detection upper electrode 213A of the shear force detection piezoelectric body 210A arranged on the −X direction side is formed to be long in the Y direction, and is arranged to cover the shear force detection piezoelectric film 211A. A second electrode connection part 213A1 extending to the first electrode connection part 212B1 is continuously formed in the +X direction at each of the +Y direction side end and the −Y direction side end of the shear force detection upper electrode 213A. That is, in the second electrode connection part 213A1, the extended tip is laminated on the first electrode connection part 212B1, so that the shear force detection upper electrode 213A and the shear force detection lower electrode 212B are electrically connected to each other.

Further, the shear force detection upper electrode 213B of the shear force detection piezoelectric body 210B arranged on the +X direction side is formed to extend from a portion on the shear force detection piezoelectric film 211B in the −X direction to a portion on the +X direction side end of the shear force detection lower electrode 212A protruding in the +X direction from the +X direction side edge of the shear force detection piezoelectric film 211A. That is, in the shear force detection upper electrode 213B, the −X direction side end is laminated on the shear force detection lower electrode 212A, so that the shear force detection upper electrode 213B and the shear force detection lower electrode 212A are electrically connected to each other.

In the shear force detection device 200D having the structure as described above, a part of the arithmetic circuit 220 as shown in FIG. 9 of the first embodiment is formed on the shear force detection membrane 141 or in the vicinity of the shear force detection membrane 141. Accordingly, the shear force detection signal can be obtained in which the electric signals outputted from the shear force detection piezoelectric bodies 210A and 210B are added and amplified. In the shear force detection device 200D, the shear force detection signal can be obtained by connecting a lead line or an electrode pattern to one of the shear force detection lower electrode 212A and the shear force detection upper electrode 213B and one of the shear force detection lower electrode 212B and the shear force detection upper electrode 213A. Thus, the structure can be simplified, and a wiring connection process and a wiring pattern formation process can be easily performed.

Figure 19:
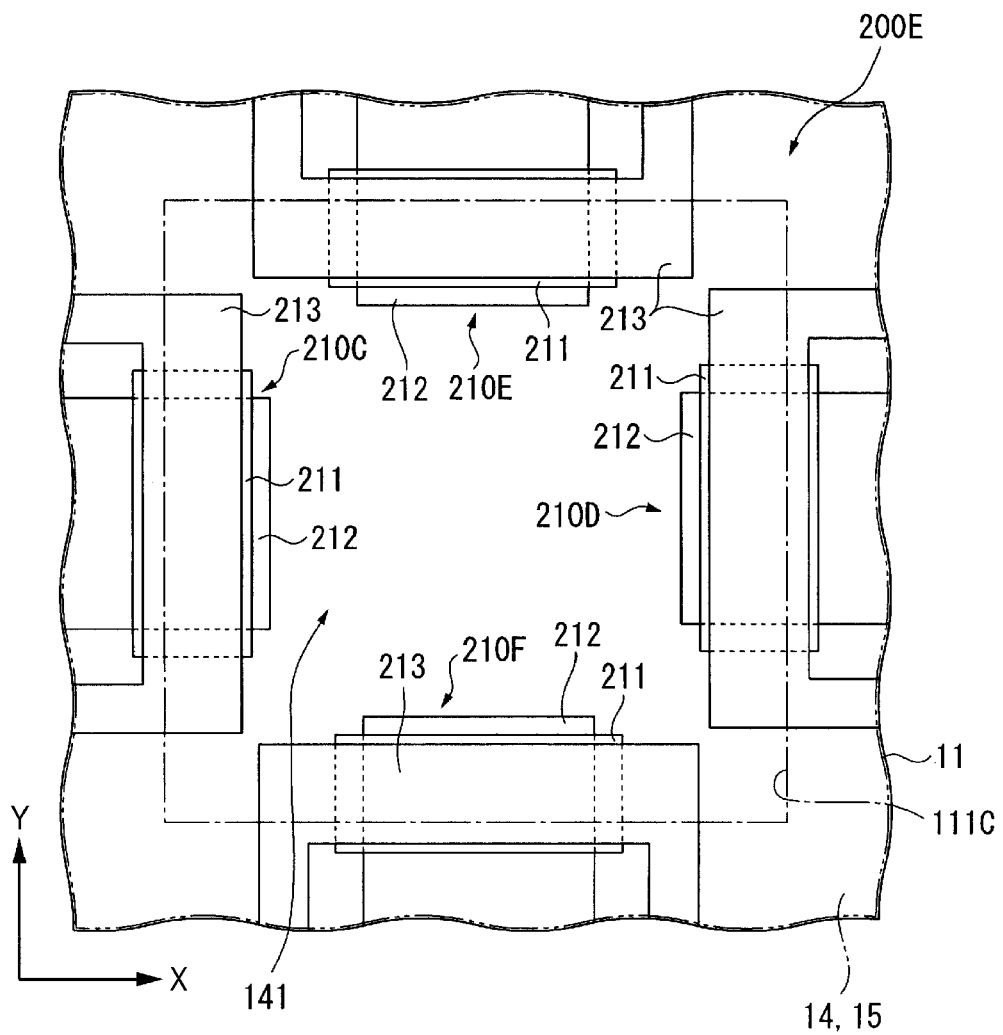
FIG. 19 is a plan view showing a structure of a shear force detection device of still another embodiment.

In the first to the third embodiments and the embodiments of FIG. 16 to FIG. 18B, the structure is exemplified in which the one shear force detection device 200, 200A, 200B, 200C, or 200D detects the shear force acting in the X direction. However, as shown in FIG. 19, a structure may be such that shear forces in both the X direction and the Y direction is detected. FIG. 19 is a plan view showing a shear force detection device 200E capable of detecting shear forces in the X direction and the Y direction.

That is, as shown in FIG. 19, a square shear force detection opening part 111C is formed in a sensor substrate 11, and a support film 14 to close the shear force detection opening part 111C is formed. Shear force detection piezoelectric bodies 210C, 210D, 210E, 210F extending astride the inside and outside of a shear force detection membrane 141 are formed on the respective sides of the shear force detection opening part 111C. In the shear force detection device 200E having the structure as stated above, the shear force detection piezoelectric bodies 210C and 210D formed along the side parallel to the Y direction detect the shear force in the X direction, and the shear force detection piezoelectric bodies 210E and 210F formed along the side parallel to the X direction detect the shear force in the Y direction.

In the shear force detection device 200 having the structure as stated above, since the one shear force detection device 200E can detect the shear forces in the X direction and the Y direction, the tactile sensor 10 can be miniaturized.

In the first embodiment, although the arithmetic circuit 220 to add the electric signals outputted from the shear force detection piezoelectric body 210A and the shear force detection piezoelectric body 210B is exemplified, no limitation is made to this. For example, a structure may be such that the electric signal outputted from the shear force detection piezoelectric body 210A and the electric signal outputted from the shear force detection piezoelectric body 210B are outputted to a subtraction circuit, and the shear force is detected by calculating the difference by the subtraction circuit. Also in this case, since the electric signals outputted from the shear force detection piezoelectric body 210A and the shear force detection piezoelectric body 210B have values different in positive and negative signs, when they are subtracted by the subtraction circuit, an output value having a large absolute value can be resultantly obtained.

Further, in the above respective embodiments, although the shear force detection upper electrode 213 and the shear force detection lower electrode 212 are provided at positions where they do not overlap with each other when viewed in a sensor plane so as to prevent them from contacting with each other, no limitation is made to this. For example, when an insulating film is formed between the shear force detection upper electrode 213 and the shear force detection lower electrode 212, the shear force detection upper electrode 213 and the shear force detection lower electrode 212 may be provided at positions where parts thereof overlap with each other when viewed in a sensor plane.

In the second embodiment, although the reinforcing film 230 is formed above the support reinforcing part 114, for example, the structure may be such that the reinforcing film 230 is not provided.

In the third embodiment, although the structure is exemplified in which the plate-like elastic members 151 are provided along the X direction, the size of the plate-like elastic member 151 in the Y direction may be formed to be the same as the length of the long side 111A of the shear force detection opening part 111, or may be formed to be shorter than the long side 111A and the elastic members are provided side by side along the Y direction.

Figure 20:
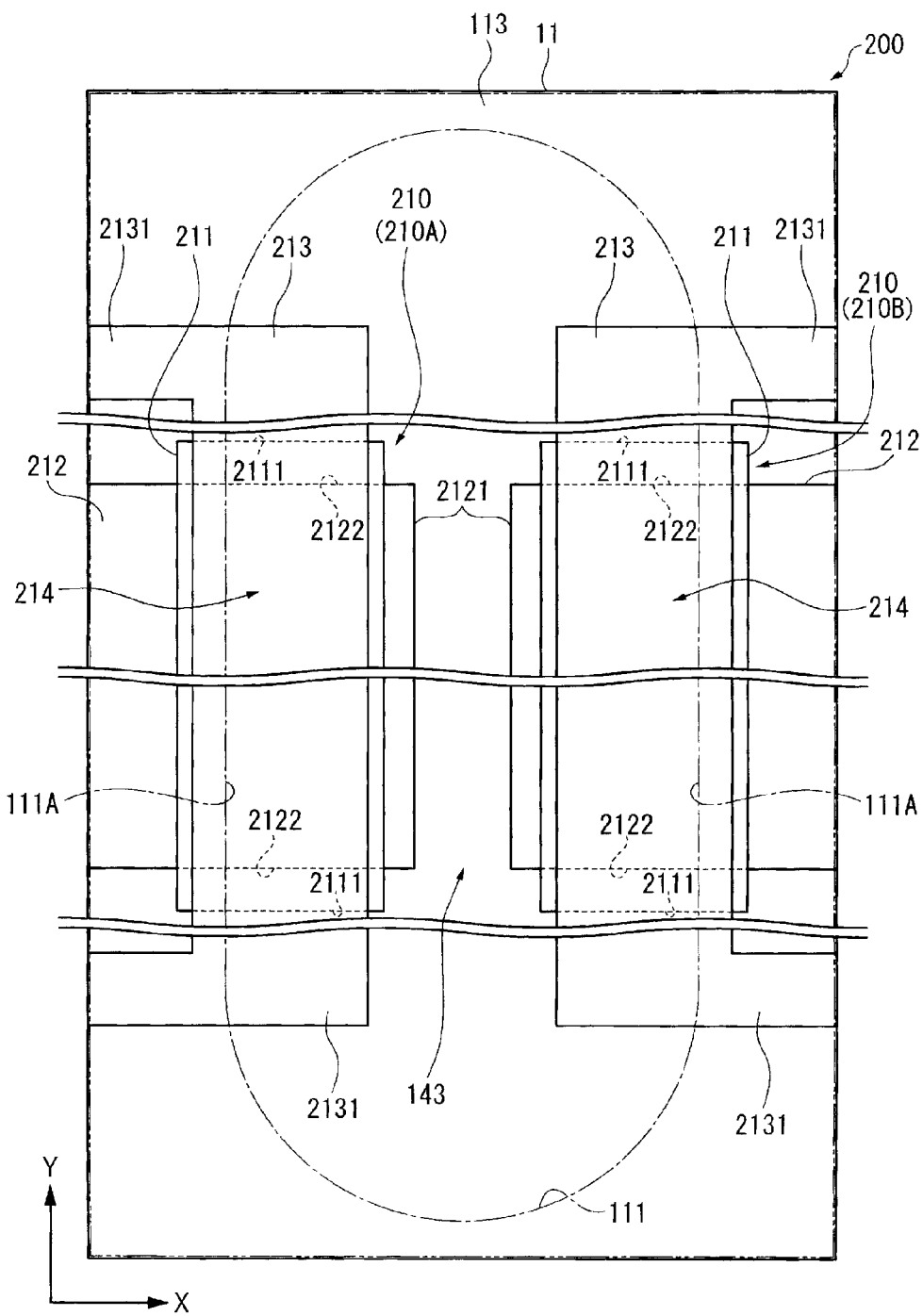
FIG. 20 is a plan view showing a structure of a shear force detection device of still another embodiment.

Further, in the first to the fifth embodiments, although the shear force detection opening part 111 constituting the shear force detection device 200 is formed to be rectangular when viewed in a plane, no limitation is made to this. The shape of the shear force detection opening part 111 is arbitrary as long as a distortion having a sine waveform shape is generated in the shear force detection membrane 141 when a shear force acts along the shear force detection direction (X direction in the first to the third embodiments). Accordingly, as shown in FIG. 20, a shear force detection opening part 111D may be formed into a shape in which a pair of straight parts 111D1 parallel to each other are provided and both ends of the straight parts 111D1 are coupled by semicircles 111D2. In the shear force detection opening part 111D as stated above, when the shear force detection piezoelectric body 210 is formed along the straight part 111D1, the shear force acting in the direction perpendicular to the straight part 111D1 can be detected.

In the first embodiment, although the compliance part 143 is formed at the position where the shear force detection piezoelectric body 210 on the shear force detection membrane 141 is not formed, no limitation is made to this. For example, in the shear force detection membrane 141, a concave groove parallel to the long side 111A may be formed at the center position between the short sides 111B and 111B. In this case, since the thickness of the concave groove portion is thin and soft as compared with the other region of the support film 14, the compliance part 143 is obtained.

Although the example is described in which the support body according to the invention is formed of the one sensor substrate 11, a structure may be such that one support substrate (support body) is provided for each of the shear force detecting parts 13A and 13B and the positive pressure detecting part 12, and the support substrates are fixed to the sensor substrate to form the tactile sensor 10.

Further, although the structure is exemplified in which the pair of grasping arms 2 are provided in the grasping apparatus 1, the structure may be such that three or more grasping arms are moved in the direction of approaching and separating each other to grasp the object A. The structure may be such that a drive arm driven by an arm driving part and a not-driven fixed arm or fixed wall are provided, and the drive arm is moved to the fixed arm (fixed wall) side to grasp the object.

Further, although the example is described in which the shear force detection device 200, 200A, 200B, 200C, 200D or 200E is applied to the grasping apparatus 1 to grasp the object A, no limitation is made to this. For example, the tactile sensor 10 including the shear force detection device 200, 200A, 200B, 200C, 200D or 200E may be applied as, for example, an input apparatus or a measuring apparatus to measure a shear force. When used as the input apparatus, the tactile sensor can be incorporated in, for example, a notebook computer or a personal computer. Specifically, a structure in which the tactile sensor 10 is provided on the surface part provided in a plate-like input apparatus body is exemplified. In the input apparatus as stated above, when a finger of a user is moved on the surface part or a touch pen is moved, a shear force is generated by these movements. The shear force sensor 10 detects the shear force, so that the contact position coordinate and the movement direction of the finger of the user or the touch pen can outputted as an electric signal. As the shear force measuring apparatus, the invention can be applied to, for example, a measuring apparatus to measure the grip force of a tire.

What is claimed is:

1. A tactile sensor comprising:
a plurality of shear force detection devices each including:
  a support body including an opening defined by a pair of straight parts perpendicular to a detection direction of the shear force and parallel to each other;
  a support film on the support body and closing the opening, the support film having flexibility;
  a piezoelectric part on the support film and extending astride an inside and outside of the opening and along at least one of the pair of straight parts of the opening when viewed in a plane in which the support body is seen in a substrate thickness direction, the piezoelectric part being bendable to output an electric signal; and
  an elastic layer covering the piezoelectric part and the support film; and
a first direction shear force detecting part in which the straight part of the shear force detection device is provided along a first direction, and
a second direction shear force detecting part in which the straight part of the shear force detection device is provided along a second direction different from the first direction.

2. The tactile sensor according to claim 1, further comprising a positive pressure detecting part to detect a pressure in a contact direction perpendicular to a surface direction of the support film at a time of contact with an object, wherein
the positive pressure detecting part includes:
  a positive pressure detection opening opened in the support body;
  a support film closing the positive pressure detection opening and having flexibility;
  a positive pressure detection piezoelectric body on the support film and inside the positive pressure detection opening when viewed in the plane in which the support body is seen in the substrate thickness direction, and is bendable to output an electric signal, and
  an elastic layer to cover the positive pressure piezoelectric body and the support film.

3. A grasping apparatus for grasping an object, comprising:
a tactile sensor including:
  a plurality of shear force detection devices each including:
    a support body including an opening defined by a pair of straight parts perpendicular to a detection direction of the shear force and parallel to each other;
    a support film on the support body and closing the opening, the support film having flexibility;
    a piezoelectric part on the support film and extending astride an inside and outside of the opening and along at least one of the pair of straight parts of the opening when viewed in a plane in which the support body is seen in a substrate thickness direction, the piezoelectric part being bendable to output an electric signal; and
    an elastic layer covering the piezoelectric part and the support film; and
  a first direction shear force detecting part in which the straight part of the shear force detection device is provided along a first direction, and
  a second direction shear force detecting part in which the straight part of the shear force detection device is provided along a second direction different from the first direction; and
at least a pair of grasping arms which grasp the object and in which the tactile sensor is provided on a contact surface to contact with the object;
a grasping detection unit that detects a slide state of the object based on the electric signal outputted from the tactile sensor; and
a drive control unit that controls driving of the grasping arms based on the slide state.

* * * * *